(12) United States Patent
Davies et al.

(10) Patent No.: US 11,425,830 B2
(45) Date of Patent: Aug. 23, 2022

(54) HINGE MECHANISM OF A DEVICE MOUNT

(71) Applicant: Meta Platforms, Inc., Menlo Park, CA (US)

(72) Inventors: Joshua Davies, Oakland, CA (US); Oliver Ross, San Francisco, CA (US)

(73) Assignee: Meta Platforms, Inc., Menlo Park, CA (US)

( * ) Notice: Subject to any disclaimer, the term of this patent is extended or adjusted under 35 U.S.C. 154(b) by 0 days.

(21) Appl. No.: 16/589,062

(22) Filed: Sep. 30, 2019

(65) Prior Publication Data
US 2020/0113073 A1  Apr. 9, 2020

Related U.S. Application Data

(60) Provisional application No. 62/742,175, filed on Oct. 5, 2018.

(51) Int. Cl.
*H05K 5/02* (2006.01)
*F16M 11/10* (2006.01)
(Continued)

(52) U.S. Cl.
CPC ............ *H05K 5/0217* (2013.01); *F16C 11/04* (2013.01); *F16C 11/10* (2013.01); *F16M 11/105* (2013.01);
(Continued)

(58) Field of Classification Search
CPC ........ F16M 11/04; F16M 11/08; F16M 11/06; F16M 11/105; F16M 11/22;
(Continued)

(56) References Cited

U.S. PATENT DOCUMENTS 1,201,328 A * 10/1916 Moran ................. F16C 33/60
384/492
5,779,309 A * 7/1998 Lu ........................... A47C 3/18
248/349.1
(Continued)

FOREIGN PATENT DOCUMENTS

CN         104948881 A      9/2015
GB         2392952 B       12/2005
(Continued)

OTHER PUBLICATIONS

PCT International Search Report and Written Opinion, PCT Application No. PCT/US2019/054452, dated Jan. 17, 2020, eight pages.
(Continued)

*Primary Examiner* — James Wu
(74) *Attorney, Agent, or Firm* — Fenwick & West LLP

(57) ABSTRACT

A device mount mounts a display with an aspect ratio greater than or less than 1:1. A camera is integrated into the device mount at a position above a top edge of the display. A hinge of the device mount rotates the mounted display. A mounting plate of the hinge couples the hinge to the device mount, and a shuttle of the hinge couples the display to the hinge to rotate the display between a landscape mode and a portrait mode. The hinge is configured such that rotation of the display from landscape mode into portrait mode translates a (Continued)

center of the display away from the camera on a vertical axis and rotation of the display back to landscape mode translates the center of the display towards the camera on the vertical axis.

16 Claims, 24 Drawing Sheets

(51) Int. Cl.
*F16M 11/22* (2006.01)
*F16C 11/04* (2006.01)
*G03B 17/56* (2021.01)
*H05K 5/00* (2006.01)
*F16C 11/10* (2006.01)

(52) U.S. Cl.
CPC ........... *F16M 11/22* (2013.01); *G03B 17/561* (2013.01); *H05K 5/0017* (2013.01); *H05K 5/0204* (2013.01); *F16M 2200/021* (2013.01); *F16M 2200/041* (2013.01)

(58) Field of Classification Search
CPC ....... F16M 2200/041; F16M 2200/021; F16M 13/00; F16C 11/04; F16C 11/10; F16C 15/00; F16C 17/02; F16C 17/022; F16C 19/04; H05K 5/0217; H05K 5/0204; H05K 5/0017; G03B 17/561
See application file for complete search history.

(56) References Cited

U.S. PATENT DOCUMENTS

| 6,189,842 | B1 | 2/2001 | Bergeron Gull et al. |
| 7,092,246 | B2 * | 8/2006 | Tanaka ................. G06F 1/1613 361/679.27 |
| 8,471,820 | B2 * | 6/2013 | Holman, IV .......... G06F 1/1622 345/169 |
| 8,593,801 | B2 * | 11/2013 | Minowa .............. H04M 1/0237 361/679.3 |
| 9,625,793 | B1 * | 4/2017 | Lai ...................... H04M 1/0237 361/679.3 |
| 9,980,561 | B1 | 5/2018 | Constantino et al. |
| 2014/0016922 | A1 | 1/2014 | Greenthal |
| 2015/0223354 | A1 | 8/2015 | Olsen et al. |
| 2017/0051865 | A1 | 2/2017 | Chen et al. |
| 2019/0069422 | A1 * | 2/2019 | Choi ................... F16M 11/105 |

FOREIGN PATENT DOCUMENTS

| GB | 2558935 B | 1/2020 |
| WO | 02093007 A2 | 11/2002 |

OTHER PUBLICATIONS

Office Action dated Mar. 7, 2022 for Chinese Application No. 201980065311.7, filed Oct. 3, 2019, 18 pages.

* cited by examiner

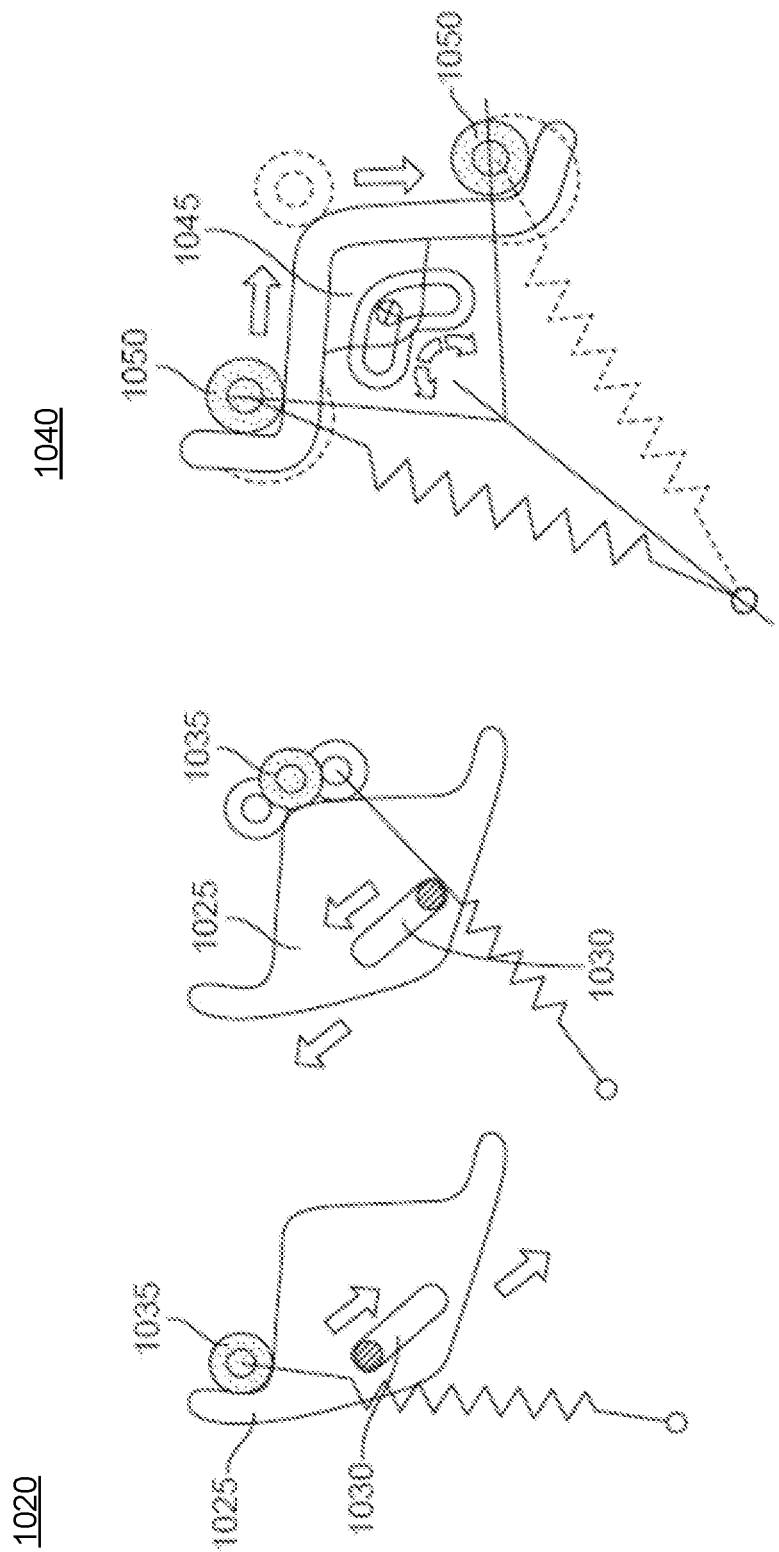

HINGE MECHANISM OF A DEVICE MOUNT

CROSS REFERENCE TO RELATED APPLICATIONS

This application claims the benefit of U.S. Provisional Application No. 62/742,175, filed Oct. 5, 2018, which is incorporated by reference in its entirety.

SUMMARY

This disclosure relates generally to a hinge mechanism, and specifically to a hinge mechanism of a display mount that is configured to rotate a display between a portrait mode and a landscape mode.

A communication system includes a device that is mounted on a device mount, which can rest or mount on a surface. The device mount includes a camera such that the device can be used for video calls. The display is rotatably attached to the device mount to rotate between at least a landscape orientation and a portrait orientation. In either orientation, the top edge (or, alternatively, the center) of the device has the same vertical offset from the camera on the device mount. This allows the display to be rotated between orientations without the user's eye gaze moving, when seen at a remote end of the video call. The device may have a hinge mechanism that is designed to rotate the display about an off-axis pivot point, along with weighting and damping mechanisms for a natural feel. The hinge mechanism may be designed to translate the display along one or more axes. The path, speed, and/or type of movement of the display can be context-dependent. For example, the display may have a rest state, where the display covers the camera (e.g., in a powered off mode or privacy mode), and the display may have an active state (e.g., in a powered on mode or when a user is using the communication system for a video call), where the display does not cover the camera. The hinge mechanism may rotate or translate the display from the rest state to the active state such that the camera is exposed to capture images and/or video of the user.

BRIEF DESCRIPTION OF THE DRAWINGS

FIGS. 10A-10C illustrate variations of an example hinge, in accordance with one or more embodiments.

The figures depict embodiments of the present disclosure for purposes of illustration only. One skilled in the art will readily recognize from the following description that alternative embodiments of the structures and methods illustrated herein may be employed without departing from the principles, or benefits touted, of the disclosure described herein.

DETAILED DESCRIPTION

Figure 1A:
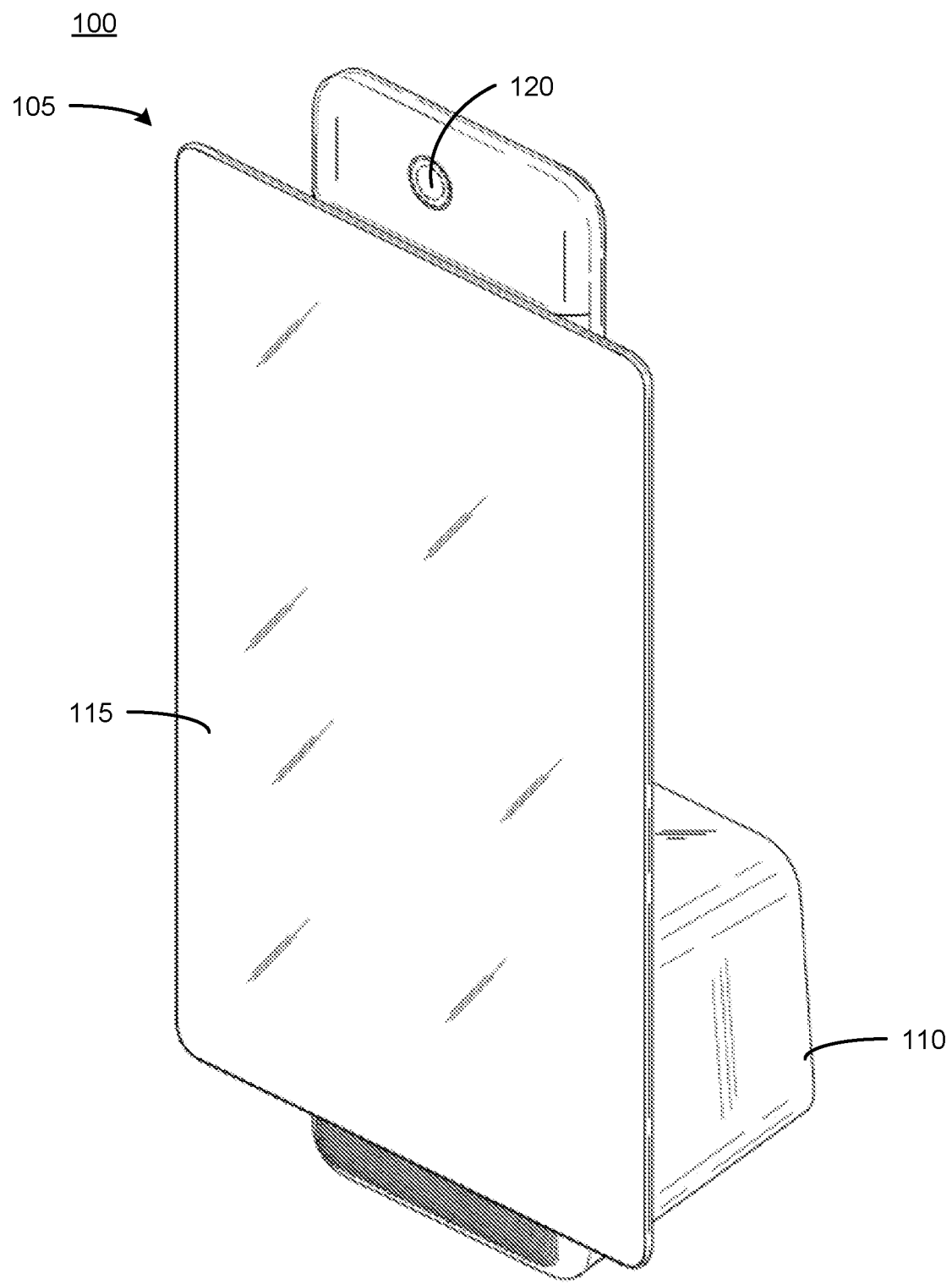
FIGS. 1A-1B illustrate a communication system in a first mode and in a second mode, in accordance with one or more embodiments.
Figure 1B:
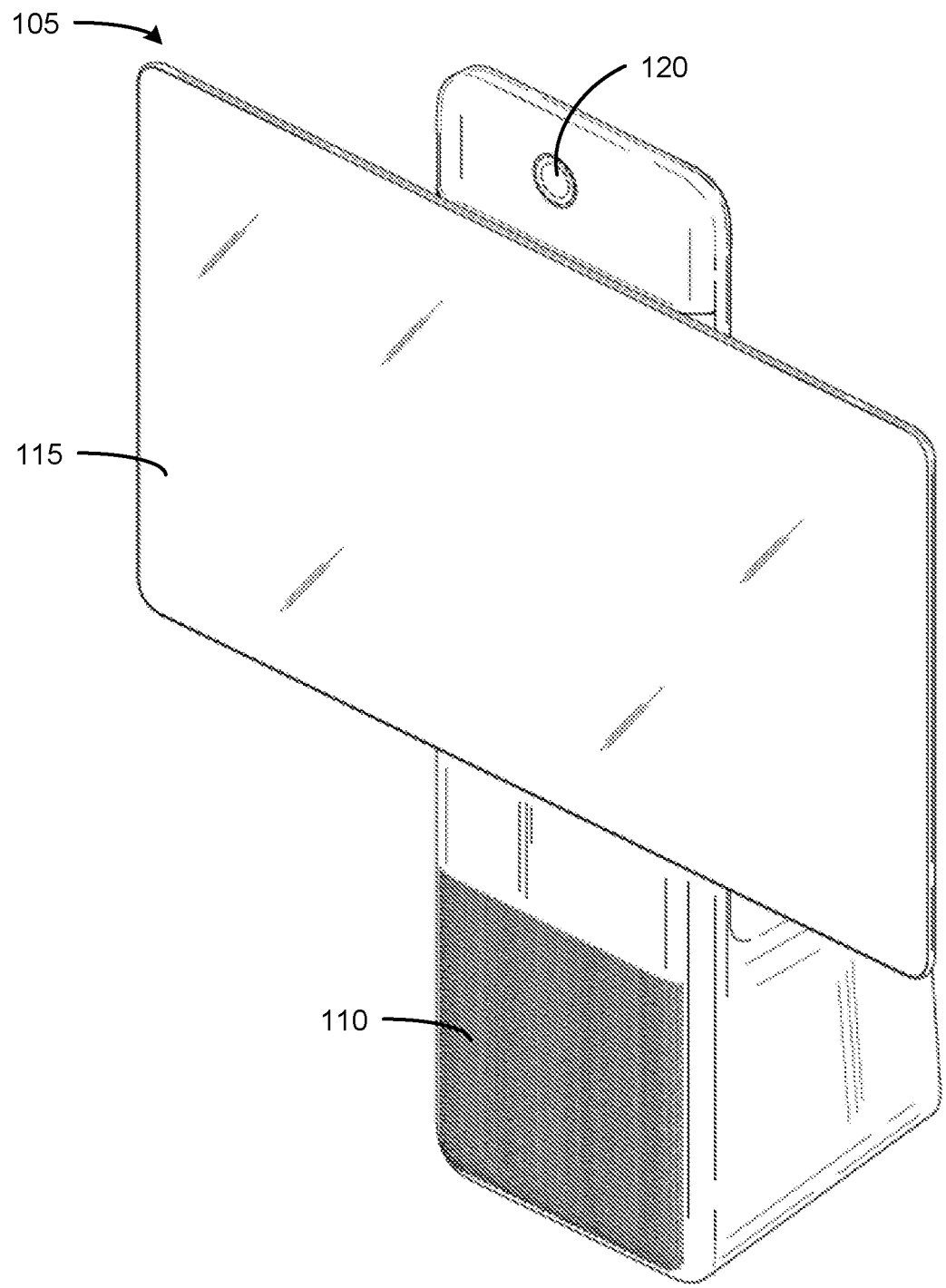

FIGS. 1A-1B illustrate a communication system 100 in a first mode and in a second mode, in accordance with one or more embodiments. The communication system 100 enables communication between users located at different locations. The communication system 100 may enable various forms of communication, such as live audio calls and/or video calls, instant messaging, email messaging, or other modes of communication. In one embodiment, the communication system 100 connects a user with one or more users, individually and/or simultaneously. In the embodiment of FIGS. 1A-1B, the communication system 100 includes a user device 105 that is secured to a device mount 110. The device 105 includes a display 115 that enables a user to view and/or interact with information displayed by the device 105. The device mount 110 includes a camera 120 that may capture images and/or video of a user of the user device 105.

The device 105 is a computing device capable of receiving user input as well as transmitting and/or receiving data via a network. In one embodiment, the device 105 is a conventional computer system, such as a desktop or a laptop computer, that may be mounted to the device mount 110. Alternatively, the device 100 may be a device having computer functionality, such as a personal digital assistant (PDA), a mobile telephone, a smartphone, a tablet, or another suitable device, that may be mounted to the device mount 110. In the embodiment of FIGS. 1A-1B, the device 100 may be configured to communicate via the network, which connects the device 105 with other devices 105 on the network. In one embodiment, the device 105 executes an application allowing a user of the device 105 to interact with a communication platform. For example, a device 105 executes a browser application to enable interaction between the device 105 and the communication platform via the network. In another embodiment, a device 105 interacts with the communication platform through an application programming interface (API) running on a native operating system of the device 105, such as IOS® or ANDROID™ Examples of a communication platform may include text and/or messaging applications, email messaging applications, social media applications, videoconferencing applications, or other suitable forms of communication. The display 110 may provide a user interface for the user to interact with the device 105, the communication platform, or some combination thereof. In one embodiment, the display 110 is a touchscreen that is configured to receive user input. The display 110 may also display a stream of a video chat, enabling a user to view a video of his/herself, a video of another user of the video chat, or some combination thereof.

The device mount 110 is a mount that secures the device 105. The device mount 110 positions the device 105 such that the display 115 may be comfortably viewed by a user of the device 105. In the embodiment of FIGS. 1A-1B, the device mount 110 positions the device 105 in a portrait mode, as illustrated in FIG. 1A, or in a landscape mode, as illustrated in FIG. 1B. In the portrait mode, the device 110 is oriented such that its height is greater than its width. In the landscape mode, the device is oriented such that its width is greater than its height. The device mount 110 includes a hinge (shown in, e.g., FIG. 4) that transitions the device 105 between the portrait mode and the landscape mode, and vice versa. The hinge is actuated by the user such that the user is able to select a preferred mode of the display 115 that is suitable for a use case of the user. The device mount 110 includes the camera 120 that may capture images and/or video of a user of the user device 105. In one embodiment, the hinge is designed such that a top edge (or, alternatively, a center) of the display 115 has a vertical offset from the camera that is the same in both the portrait mode and the landscape mode. In this configuration, an angle of the user's gaze upon the display 115 is approximately the same in either the portrait mode or the landscape mode. This may be beneficial when, for example, a user is using the device 105 to video chat with another user, and the user 105 may transition the device 105 seamlessly between the portrait mode and the landscape mode without affecting the user experience while video chatting. In one embodiment, the device mount 110 is configured to move the device 105 such that the device 105 covers the camera on the device mount 110, for example, in a privacy mode. In one embodiment, the device mount 110 may include a speaker that is configured to interface with the display 115. Various embodiments of the hinge are discussed in further detail herein.

Figure 2A:
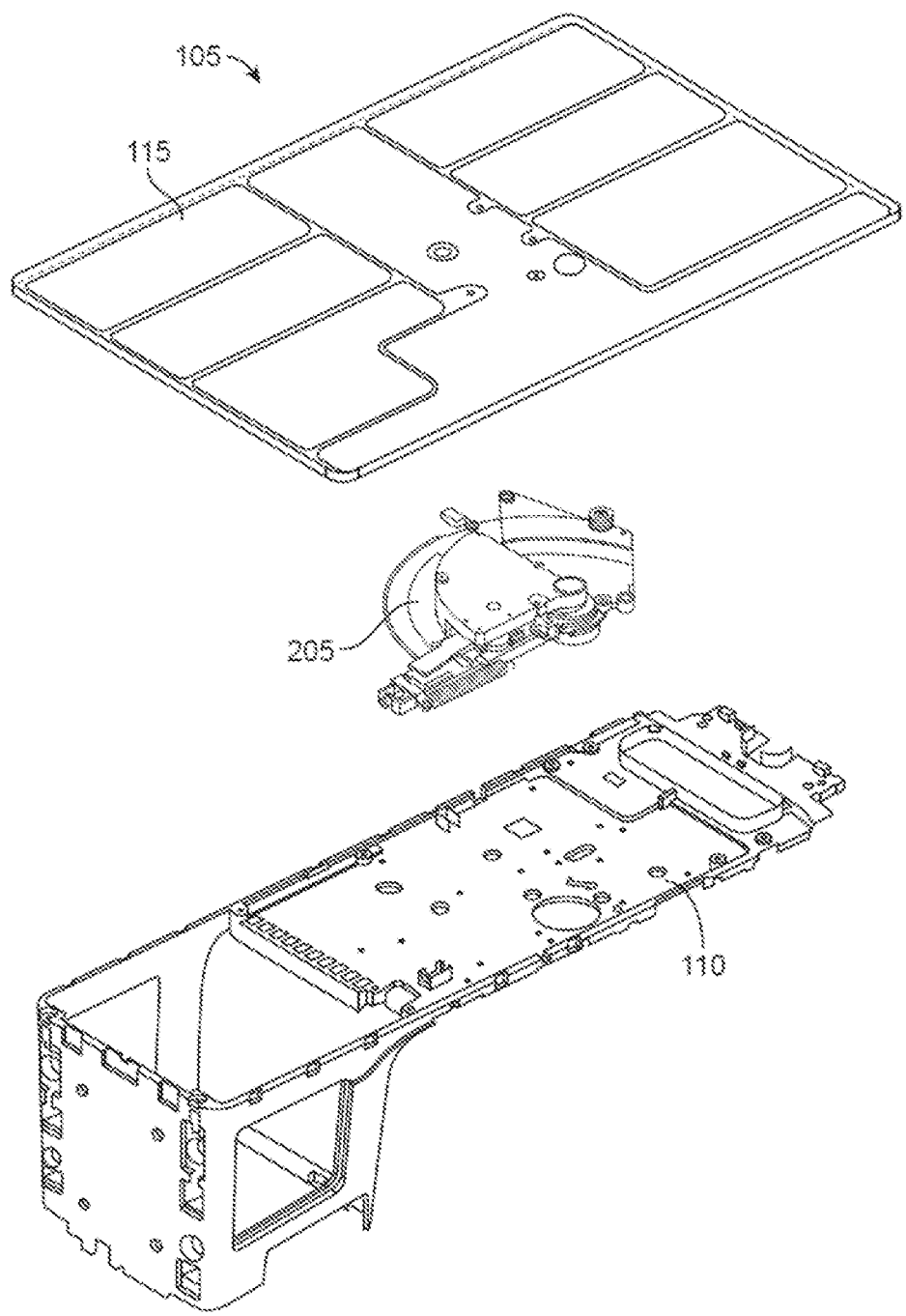
FIG. 2A illustrates an exploded view of the communication system.
Figure 2B:
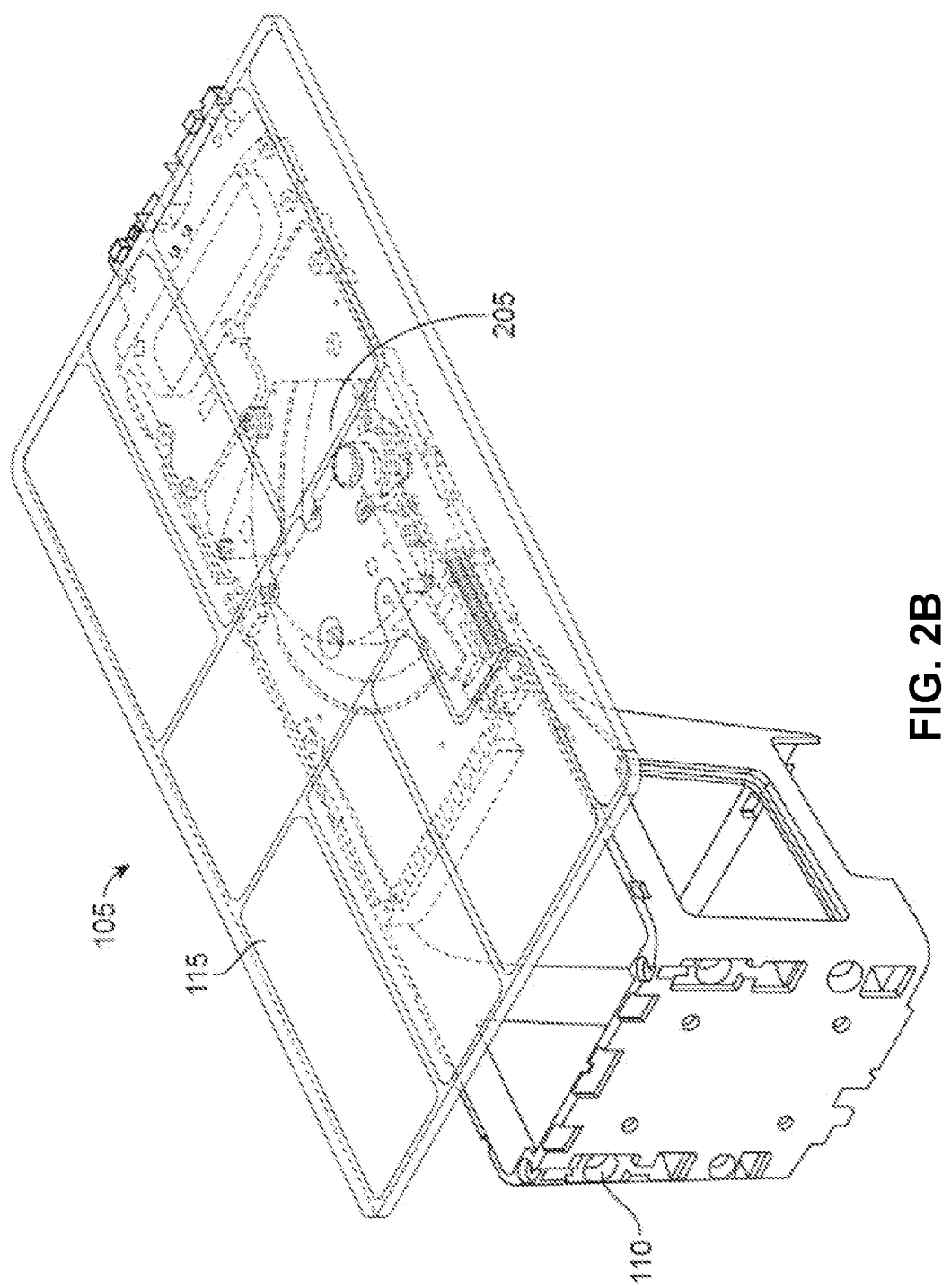
FIG. 2B illustrates a perspective view of the communication system, in accordance with one or more embodiments.

FIG. 2A illustrates an exploded view of the communication system 100, and FIG. 2B illustrates a perspective view of the communication system 100, in accordance with one or more embodiments. In the embodiment of FIGS. 2A-2B, the device 105 is mounted to the device mount 110 via a hinge 205. The hinge 205 is an assembly comprising stationary components that mount to the device mount 110 and movable components that enable movement of the device 105 relative to the device mount 110. The user actuates the hinge 205 by providing user input to, for example, the device 105 that is coupled to the hinge 205 to transition the device 105 between the portrait mode and the landscape mode. In the embodiment of FIGS. 2A-2B, a movable portion of the hinge 205 is mounted to the device 105 in an off-center position (i.e., not positioned at a center of the device 105). In this configuration, when actuated by the user, the hinge 205 moves the device 105 along a predefined path to change the orientation of the device 105 between the portrait mode and the landscape mode. The predefined path may be linear, curved, or some combination thereof, thereby causing the device 105 to translate, rotate, or some combination thereof. In the embodiment of FIGS. 2A-2B, the hinge 205 is designed to rotate the device 105 along a semi-circular path.

In alternate embodiments, the hinge is mounted to the device 105 at the center of the device 105 such that a rotational axis of the device 105 is aligned with the center of the device 105. Additional embodiments of the hinge are discussed in further detail herein.

Figure 3A:
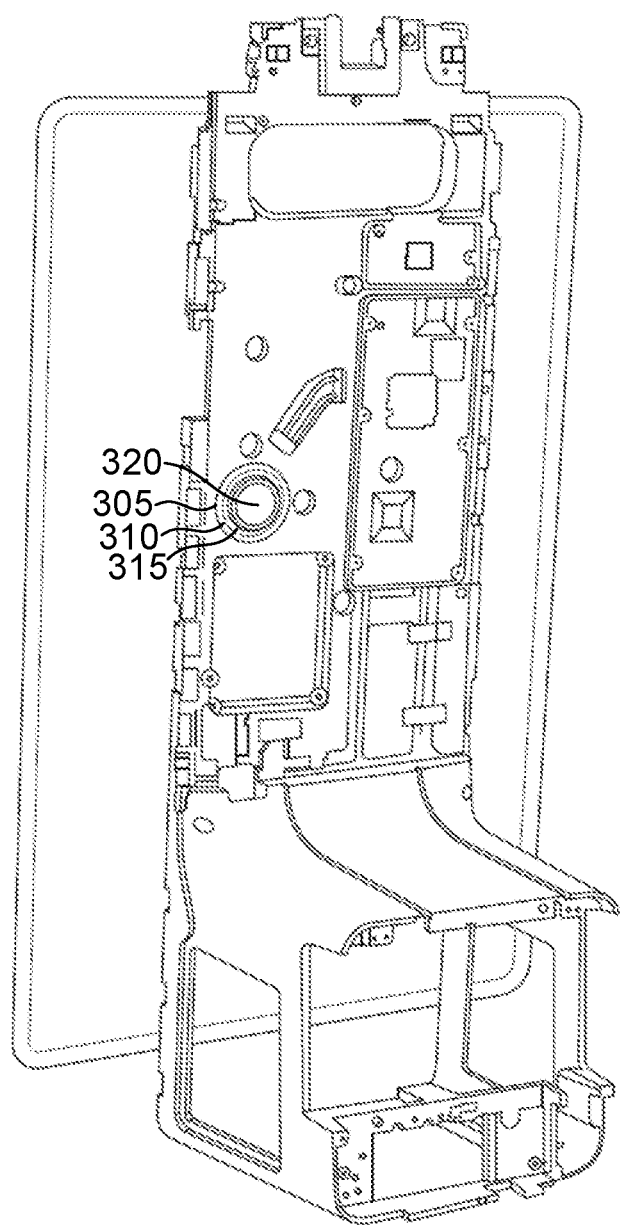
FIG. 3A illustrates a perspective view of a back side of the communication system.
Figure 3B:
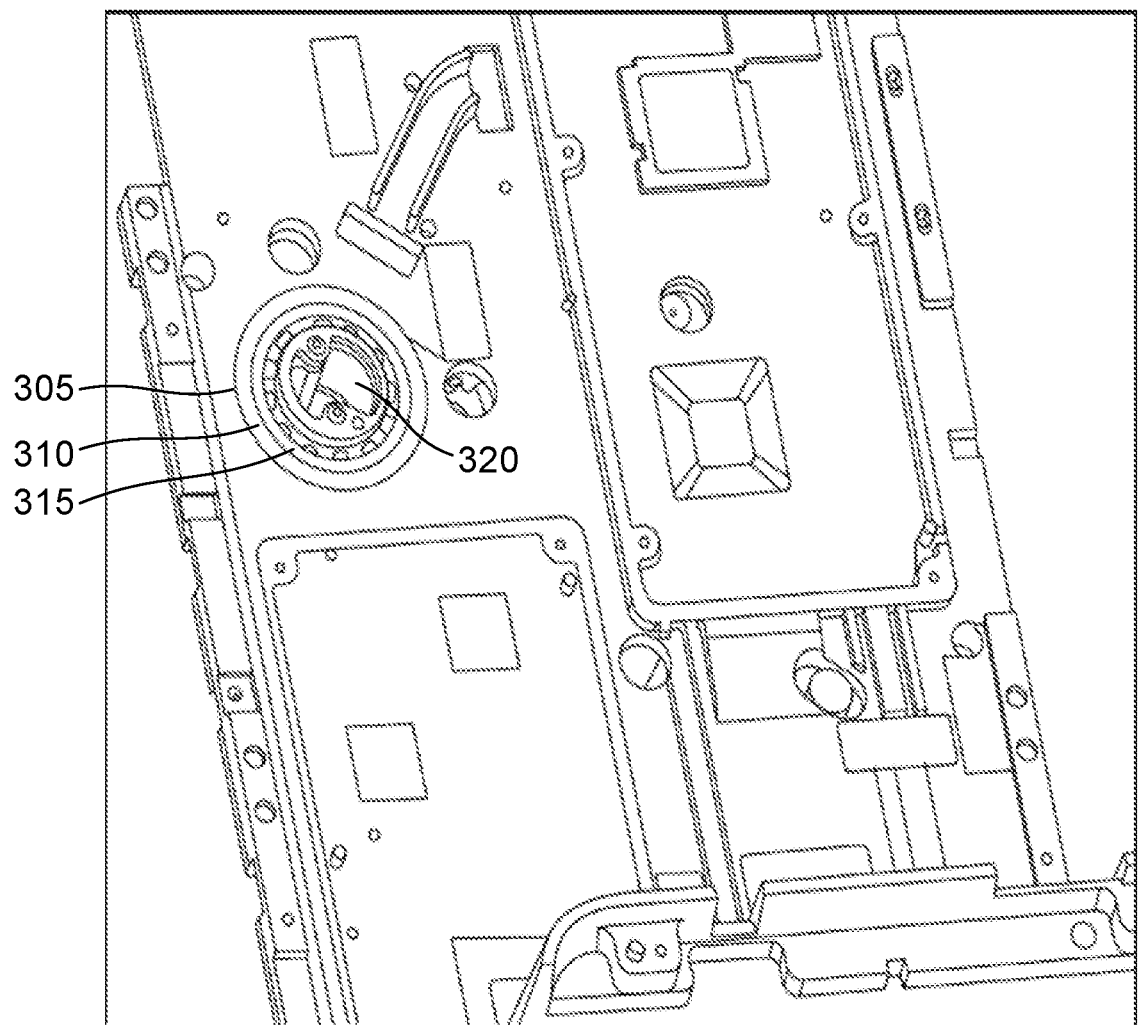
FIG. 3B illustrates a zoomed-in, perspective view of the hinge mounted to the device mount, in accordance with one or more embodiments.

FIG. 3A illustrates a perspective view of a back side of the communication system 100, and FIG. 3B illustrates a zoomed-in, perspective view of the hinge 205 mounted to the device mount 100, in accordance with one or more embodiments. In the embodiment of FIGS. 2-3, the hinge 205 includes a bearing 305. The bearing 305 includes an outer ring 310 and an inner ring 315, where the outer ring 310 is secured within an opening 320 of the device mount 100 and the inner ring 315 is rotatably mounted within the outer ring 310. In this configuration, outer ring 310 mounts the stationary components of the hinge 205 to the device mount 100 while the inner ring 315 enables the movable components of the hinge 205 to rotate relative to the device mount 100. In the embodiment of FIGS. 2-3, the hinge 205 includes a single bearing, while alternate embodiments may include more than one bearing.

Figure 4:
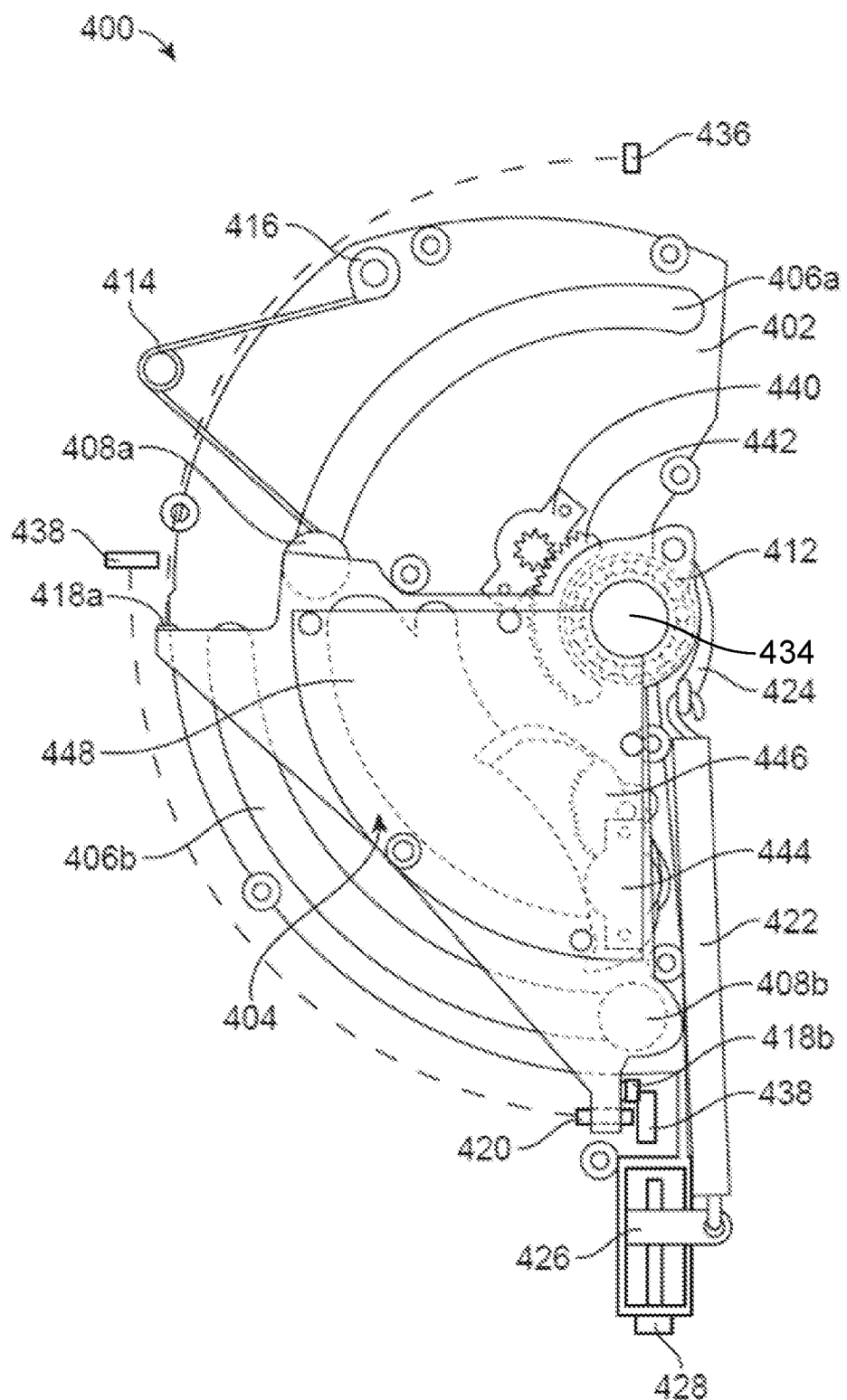
FIG. 4 illustrates a front view of an example hinge, in accordance with one or more embodiments.

FIG. 4 illustrates a front view of an example hinge 400, in accordance with one or more embodiments. The hinge 400 mounts the device 105 to the device mount 110 and enables movement of the device 105 relative to the device mount 110. In the embodiment of FIG. 4, the hinge 400 includes a mounting plate 402, a shuttle 404, one or more slots 406, one or more shuttle bushings 408, a bearing cap 410 (shown in FIGS. 5A-5B), a bearing 412, a torsion spring 414, a spring bushing 416, one or more stop blocks 418, and one or more stop locks 420. The hinge 400 may also include counterbalancing components, such as a spring 422, a spring link 424, an adjustment slide 426, and an adjustment screw 428. The hinge 400 may also include damping components (not shown), such as a gear damping mechanism and a cam damping mechanism. In the embodiment of FIG. 4, the components are generally made of rigid materials (e.g., hard plastics, metals, or some combination thereof).

The mounting plate 402 mounts the hinge 400 to the device mount 110. In the embodiment of FIG. 4, the mounting plate 402 is a stationary component that is mounted to the device mount 110 with one or more securing mechanisms (e.g., threaded components and respective threaded interfaces, mounting pins and interference fits, or other suitable securing mechanisms). The mounting plate 402 comprises an opening that receives the bearing cap 410, which is designed to secure an outer ring of the bearing 412 such that the outer ring of the bearing 412 remains stationary relative to the device mount 105 and an inner ring of the bearing 412 may freely rotate within the outer ring of the bearing 412 about a pivot point 434 (i.e., the center of the bearing 412). The mounting plate 402 comprises several mounting interfaces for securing other components of the hinge 400, which are discussed in further detail.

The shuttle 404 moves relative to the mounting plate 402. The shuttle 404 mounts to the device 105 with one or more securing mechanisms (e.g., threaded components and respective threaded interfaces, mounting pins and interference fits, or other suitable securing mechanisms). In this configuration, the shuttle 404 enables movement of the device 105 relative to the mounting plate 402, which is mounted to the device mount 110. The shuttle 404 is coupled to the mounting plate 402 with one or more shuttle bushings 408. In the embodiment of FIG. 4, the shuttle 404 includes a first shuttle bushing 408a and a second shuttle bushing 408b, which each fit into respective slots 406a, 406b on the mounting plate 402. The shuttle bushings 408 are designed to slide back and forth within the slots 406, and the slots 406 are sized such that the shuttle bushings 408 may move freely within the slots 406 without falling out of the slots 406. In the embodiment of FIG. 4, the shuttle 404 is configured to rotate about the pivot point 434, which causes corresponding movement of the shuttle bushings 408 through the slots 406. In this configuration, the slots 406 are a predefined path along which the shuttle 404 moves. As illustrated in FIG. 4, the slots 406 have a substantially uniform radius of curvature. Alternate embodiments may include slots having a different orientation or geometry depending on a type of desired motion for adjusting the orientation of the device 105 from portrait mode to landscape mode, and vice versa.

The bearing 412 enables rotation of the shuttle 404 about the pivot point 434. As previously described, the bearing 412 is secured within the bearing cap 410. In the embodiment of FIG. 4, the bearing 412 includes an outer ring, an inner ring, and a plurality of balls. The outer ring of the bearing 412 remains stationary within the bearing cap 410, and the plurality of balls enable rotation of the inner ring relative to the outer ring. The shuttle 404 may include a securing interface that secures to the inner ring of the bearing 412 such that the shuttle 404 and the inner ring rotate together about the pivot point 434.

The torsion spring 414 provides a bi-stable force to the motion of the shuttle 404 relative to the mounting plate 402. A first end of the torsion spring 414 is mounted to the mounting plate 402 with a spring bushing 416, and a second end of the torsion spring 414 is secured is secured to the first shuttle bushing 408a. In this configuration, the first end of the torsion spring 414 remains stationary while the second end of the torsion spring 414 moves with the shuttle bushing 408a along the path of the slot 406a. In the embodiment of FIG. 4, the torsion spring 414 is composed of metal wire.

The stop blocks 418 are features that are positioned on edges of the shuttle 404 to stop rotation of the shuttle 404 about the pivot point 434 at certain endpoints. The stop blocks 418 are designed to meet corresponding end stops 436 on the device mount 110 such that the shuttle 404 may not rotate past the end stops 436. The stop blocks 418 and end stops 436 ensure that the shuttle 404 stops rotating at certain endpoints such that the device 105 is in a landscape mode or a portrait mode at the endpoints.

The stop lock 420 is a magnetic component on the shuttle 404 that secures the shuttle 404 in its position at the endpoints. The stop lock 420 is designed to meet corresponding magnets 438 on the device mount 110 such that, once the stop blocks 418 meet corresponding end stops 436 at the endpoints, the shuttle 404 is secured into a landscape mode or a portrait mode. In one embodiment, the shuttle 404 may include more than one stop lock 420, for example, at each corner of the shuttle 404. In one embodiment, an end stop 436 may also be a magnet.

The spring 422 provides a counterbalancing force to a mass of the device 105 mounted to the shuttle 404. In the embodiment of FIG. 4, the spring 422 is an extension spring but may be configured as a compression spring in other embodiments. A first end of the spring 422 is coupled to the shuttle 404 with the spring link 424, and a second end of the spring 422 is coupled to the adjustment slide 426. The adjustment slide 426 includes a threaded interface that mates with the adjustment screw 428. Loosening or tightening the adjustment screw 428 causes the adjustment slide 426 to translate, which enables a tension of the spring 422 to be fine-tuned for the mass of the device 105.

The gear damping mechanism 430 dampens rotation of the shuttle 404. The gear damping mechanism 430 includes a rotary damper 440 and a gear 442. In the embodiment of FIG. 4, the rotary damper 440 is mounted to the mounting plate 402, and the gear 442 is mounted to the shuttle 404. In alternate embodiments, the components may be in switched positions. The rotary damper 440 and the gear 442 are continuously engaged, which helps to control the rotation of the shuttle 404. For example, the gear damping mechanism 430 slows down rotation of the shuttle 404 if actuated quickly and/or forcefully.

The cam damping mechanism 432 dampens rotation of the shuttle 404 at the end stops 436. The cam damping mechanism 432 includes a rotary damper 444 and a cam 446. In the embodiment of FIG. 4, the rotary damper 444 is mounted to the shuttle 404, and the cam 446 is mounted to the mounting plate 402. In alternate embodiments, the components may be in switched positions. The cam 446 is positioned within a slot 448 in the mounting plate 402 such that the cam 446 slides within the slot 448. The cam 446 slides within the slot 448 as the shuttle 404 rotates relative to the mounting plate 402, and at the endpoints of the rotation of the shuttle 404, the cam 446 is designed to abut features on the mounting plate 402. While the rotary damper 444 and the cam 446 are continuously engaged, the cam 446 rotates relative to the rotary damper 444 as the cam 446 approaches and abuts the features on the mounting plate 402. In this configuration, the cam damping mechanism 432 dampens rotation near the endpoints of the rotation of the shuttle 404.

Figure 5B:
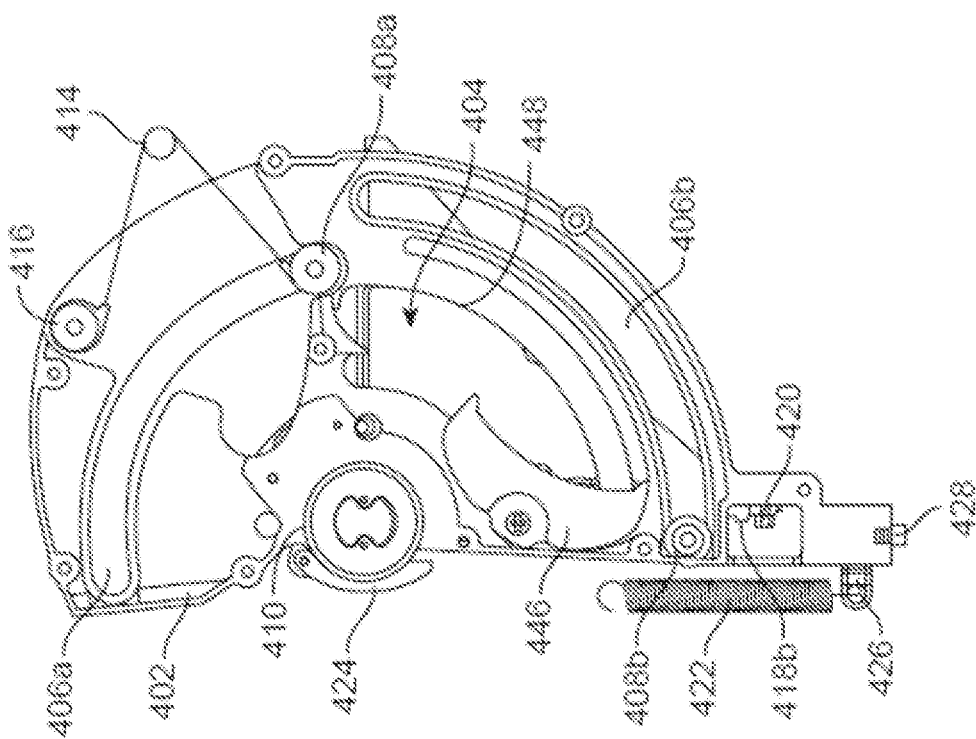
FIGS. 5A-5B illustrate a front view and a back view of the hinge of FIG. 4, in accordance with one or more embodiments.
Figure 5A:
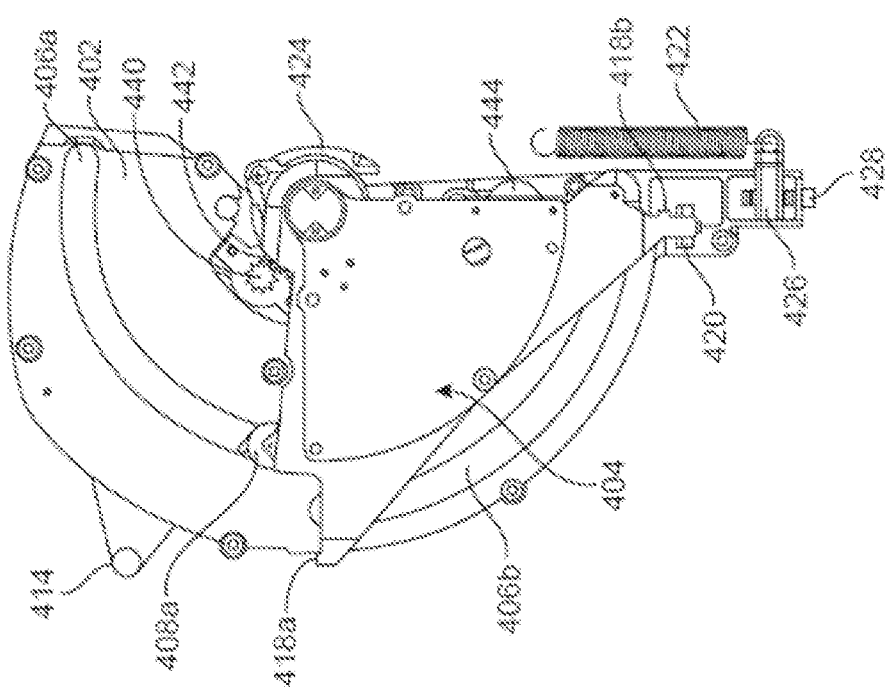

FIGS. 5A-5B illustrate a front view and a back view of the hinge 400 of FIG. 4, in accordance with one or more embodiments. In FIGS. 5A-5B, the spring 422 is uncoupled from the spring link 424.

Figure 6B:
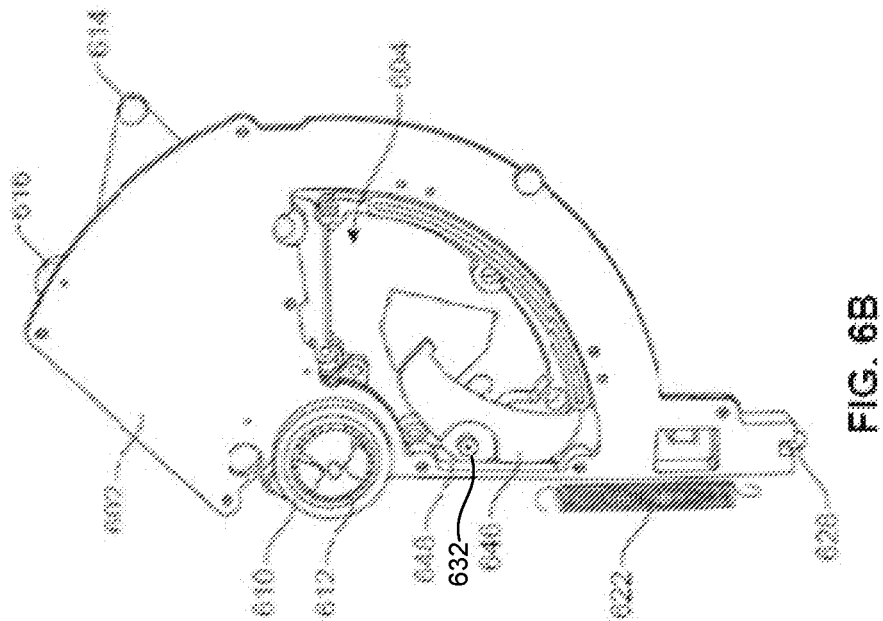
FIGS. 6A-6B illustrate a front view and a back view of an example hinge, in accordance with one or more embodiments.
Figure 6A:
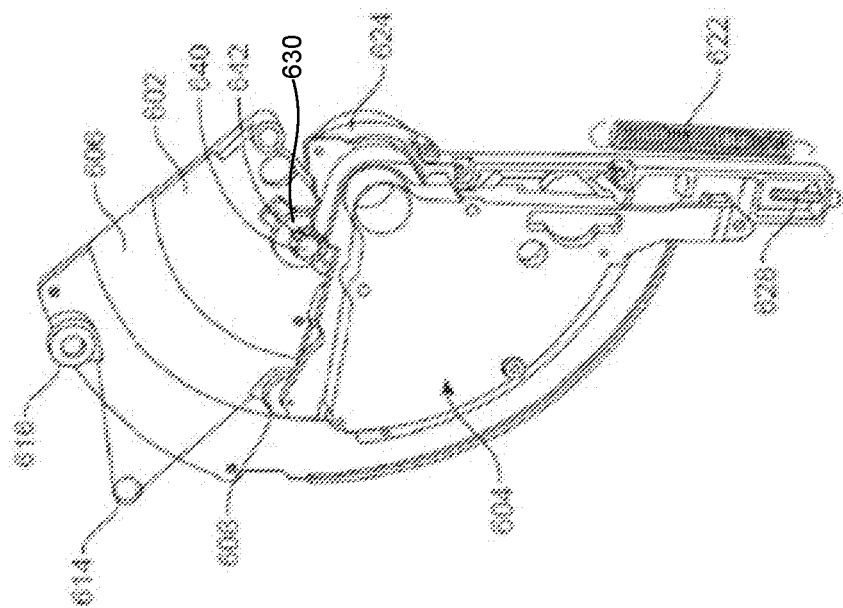

FIGS. 6A-6B illustrate a front view and a back view of an example hinge 600, in accordance with one or more embodiments. Similar to the hinge 400, the hinge 600 mounts the device 105 to the device mount 110 and enables movement of the device 105 relative to the device mount 110. In the embodiment of FIGS. 6A-6B, the hinge 600 includes a mounting plate 602, a shuttle 604, one or more tracks 606, a shuttle bushing 608, a bearing cap 610, two bearings 612, a torsion spring 614, a spring bushing 616, one or more stop blocks 618 (not shown), and one or more stop locks 620 (not shown). The hinge 600 may also include counterbalancing components, such as a spring 622, a spring link 624, an adjustment slide 626 (shown in FIG. 7), and an adjustment screw 628. The hinge 400 may also include damping components, such as a gear damping mechanism 630 and a cam damping mechanism 632. The gear damping mechanism 630 includes a rotary damper 640 and a gear 642. The cam damping mechanism 632 includes a rotary damper 644 (shown in FIG. 7) and a cam 646 that moves within a slot 648. In the embodiment of FIG. 6, the components are generally made of rigid materials (e.g., hard plastics, metals, or some combination thereof).

The hinge 600 operates similarly to the hinge 400 and has similar components to the hinge 400, such that the corresponding description from FIG. 4 is incorporated herein for FIG. 6. In the embodiment of FIGS. 6A-6B, the shuttle 604 includes one shuttle bushing 608, which is designed to slide along a track 606 on the mounting plate 602 (as opposed to sliding in an open slot). In addition, the hinge 600 includes two bearings 612 that are positioned concentrically. This configuration provides added stability to the shuttle 604 as it moves relative to the mounting plate 602 and minimizes any potential wobble of the device 105 mounted to the hinge 600.

Figure 7:
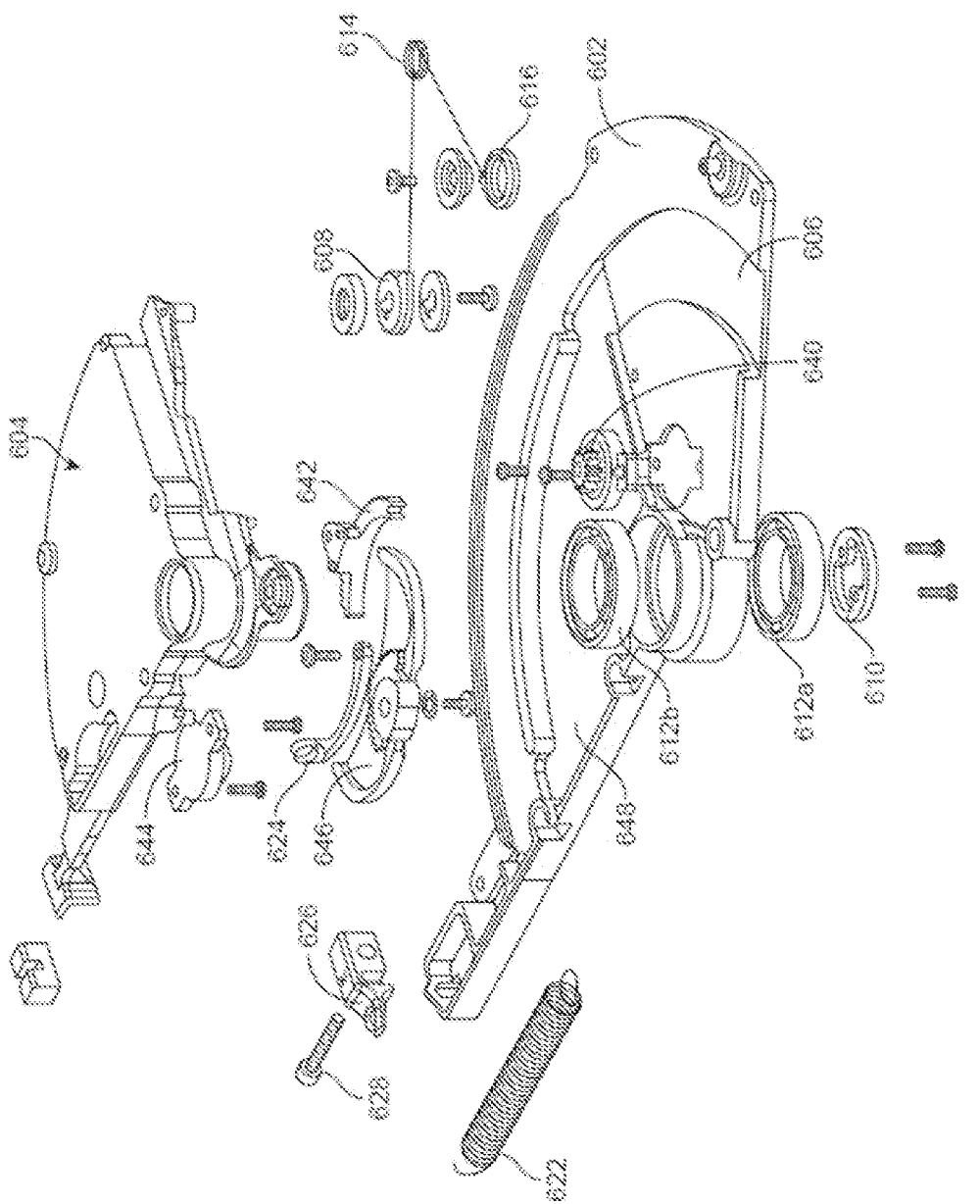
FIG. 7 illustrates an exploded view of the hinge, in accordance with one or more embodiments.

FIG. 7 illustrates an exploded view of the hinge 600, in accordance with one or more embodiments. In FIG. 7, both bearings 612a, 612b, the adjustment slide 626, and the rotary damper 644 are shown.

Figure 8C:
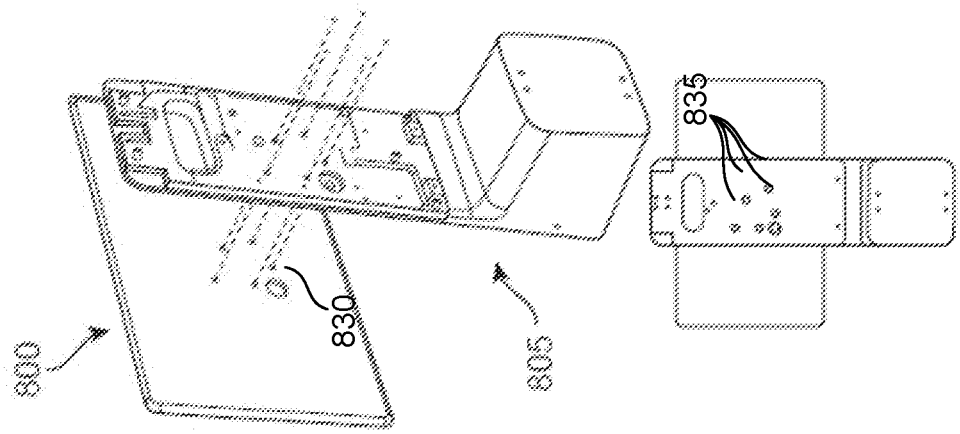
FIGS. 8A-8C illustrate a process for assembling a device to a device mount, in accordance with one or more embodiments.
Figure 8B:
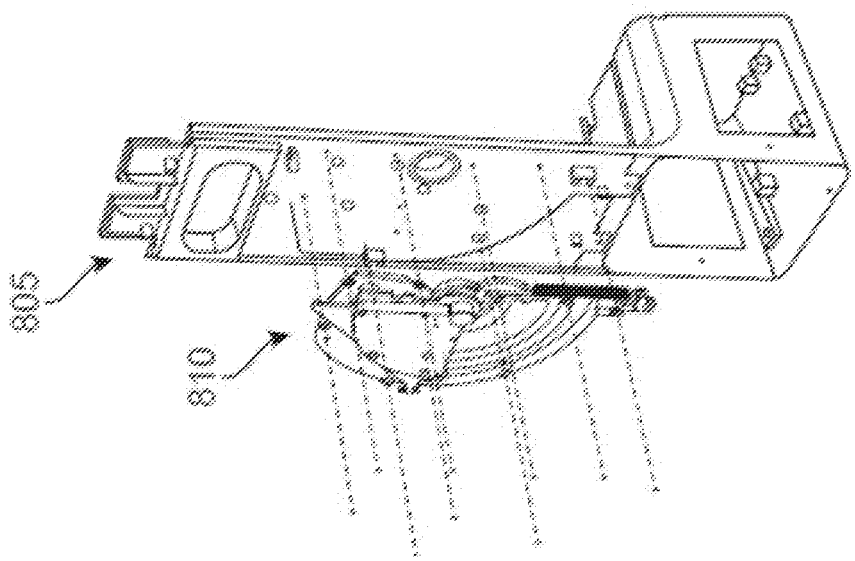
Figure 8A:
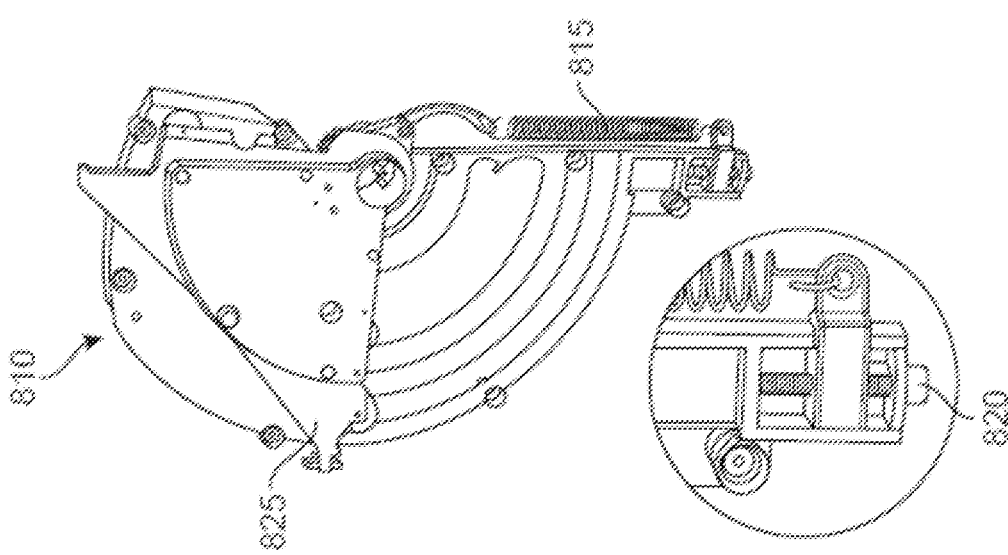

FIGS. 8A-8C illustrate a process for assembling a device 800 to a device mount 805, in accordance with one or more embodiments. In FIG. 8A, a hinge 810 may be assembled using a dummy screen fixture and a device mount fixture, such that the motion of the hinge 810 can be tested before securing it to the device 800 and the device mount 805. The spring 815 of the hinge 810 may be tensioned by tightening or loosening the adjustment screw 820. This allows the design to account for changes in a mass of the device 800. In some embodiments, a fixture may be used to streamline the tensioning of each spring of hinges that are assembled.

In FIG. 8B, the hinge 810 is positioned onto the device mount 805 by aligning the bearing with its mounting interface on the device mount 805. The hinge 810 is secured to the device mount 805 using a plurality of screws.

In FIG. 8C, the device 800 is positioned onto the hinge 810 by aligning a locating ring 830 on the device 800 with a shuttle 825 of the hinge 810. The device 800 is secured to the shuttle 825 using a plurality of screws 835 through a back side of the device mount 805.

Figure 9B:
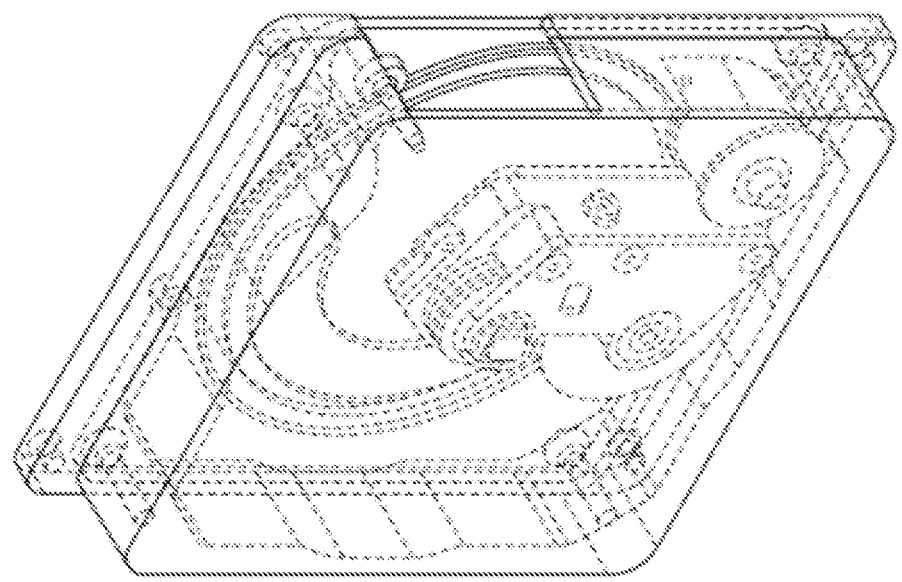
FIGS. 9A-9F illustrate an example communication system, in accordance with one or more embodiments
Figure 9A:
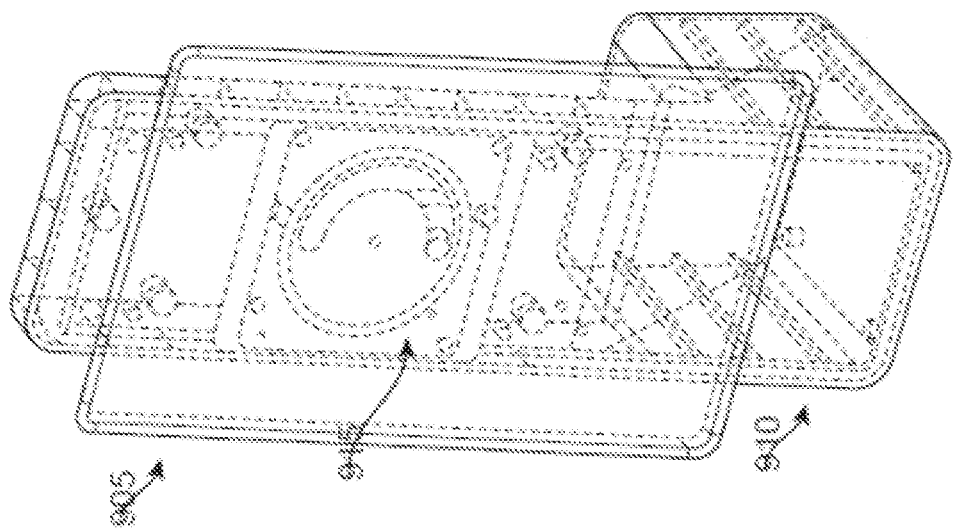
Figure 9D:
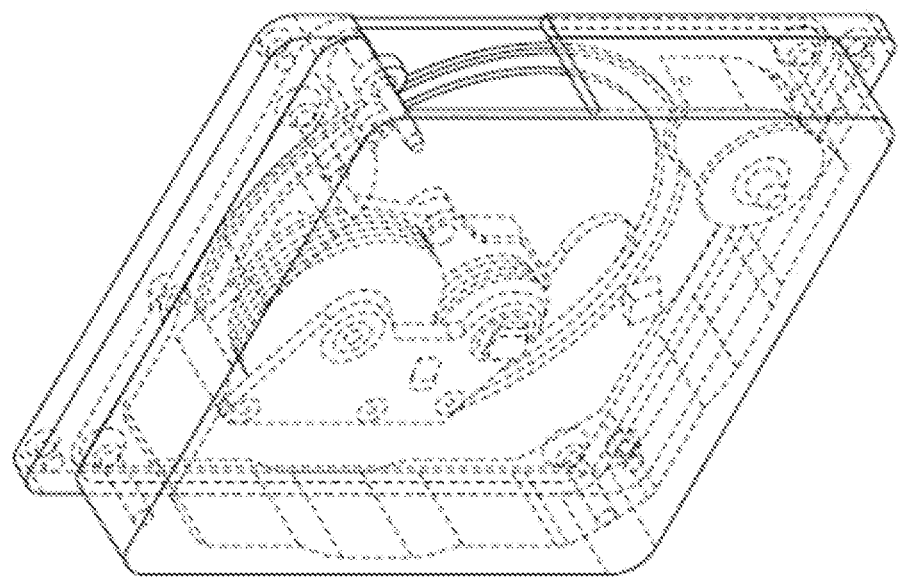
Figure 9C:
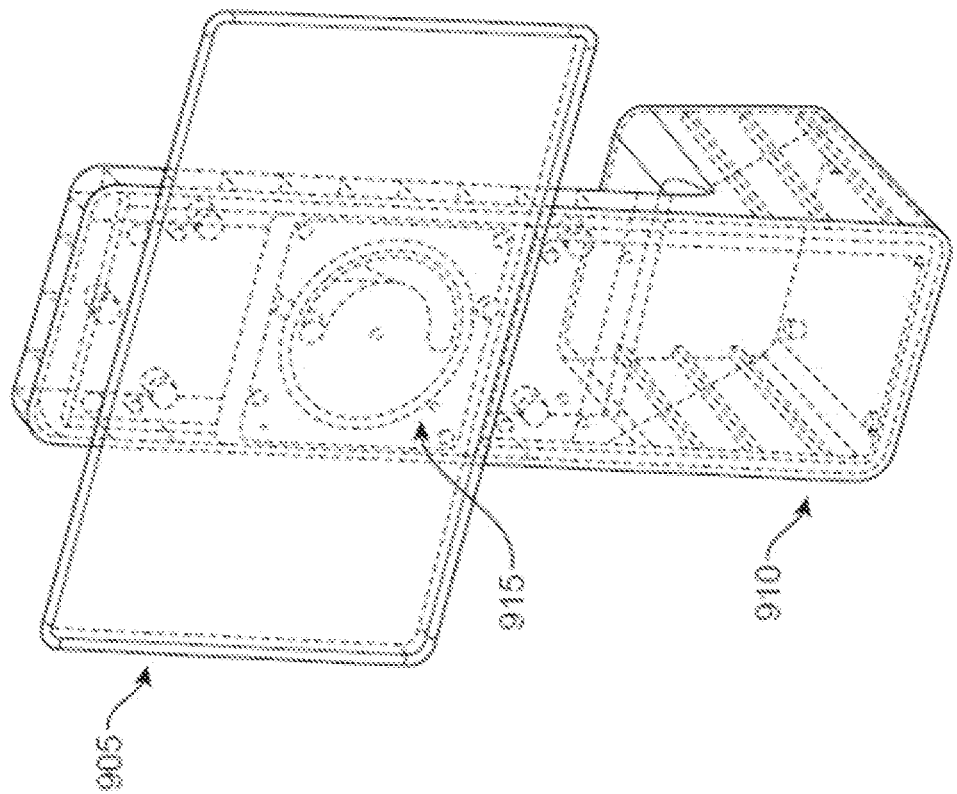
Figure 9F:
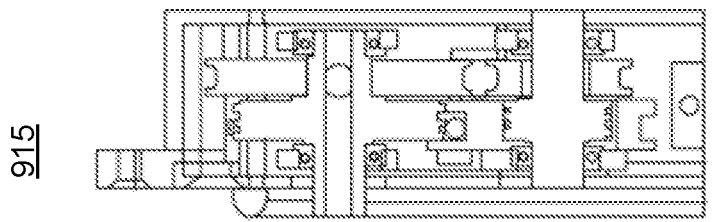
Figure 9F:
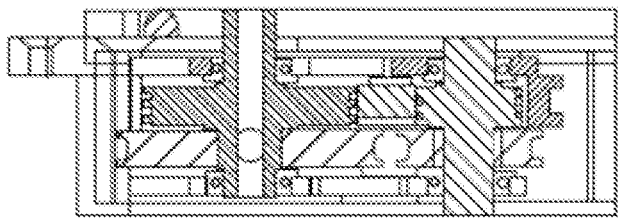
Figure 9E:
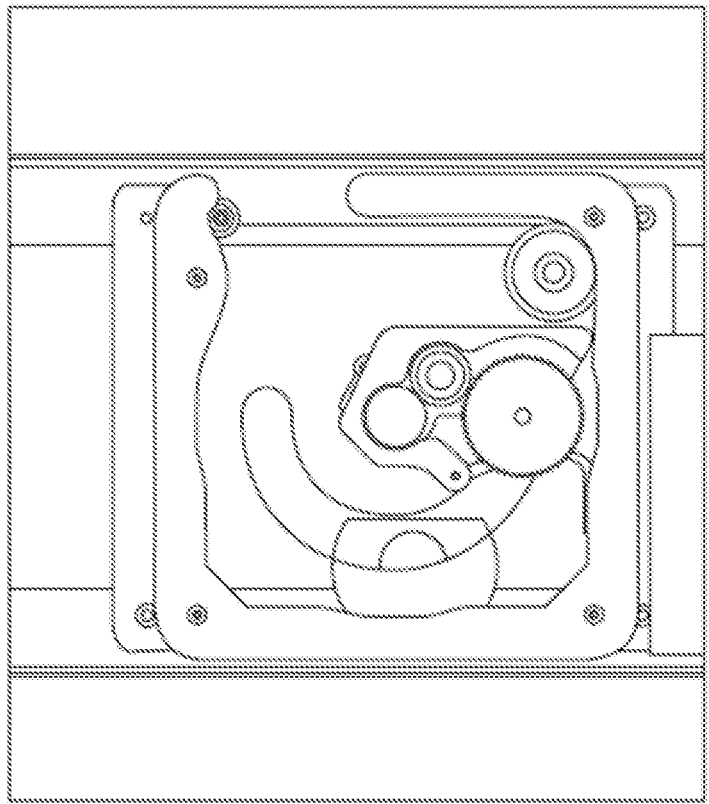

FIGS. 9A-9D illustrate an example communication system 900, in accordance with one or more embodiments. The communication system 900 includes a user device 905 that is secured to a device mount 910 via a hinge 915. While not shown in FIGS. 9A-9D, the communication system 900 may further include a camera that is positioned on the device mount 910 above a top edge of the device 905. The hinge 915 is adapted to change the orientation of the device 905 between a portrait mode and a landscape mode, and vice versa. A user may provide user input to the device 905 coupled to the hinge 915 to actuate the hinge 915 to transition between the portrait mode and the landscape mode, and vice versa. FIGS. 9A-9B illustrate the device 905 and the hinge 915 in a portrait mode, and FIGS. 9C-9D illustrate the device 905 and the hinge 915 in a landscape mode. FIG. 9E illustrates a back view of the hinge 915, and FIG. 9F illustrates a first side view and a second side view of the hinge 915.

In the embodiment of FIGS. 9A-9F, the hinge 915 uses a planetary gear system to rotate and translate the device 905 between the portrait mode and the landscape mode. Some embodiments may include a constant force spring to counterbalance the planetary gear system.

Figure 10A:
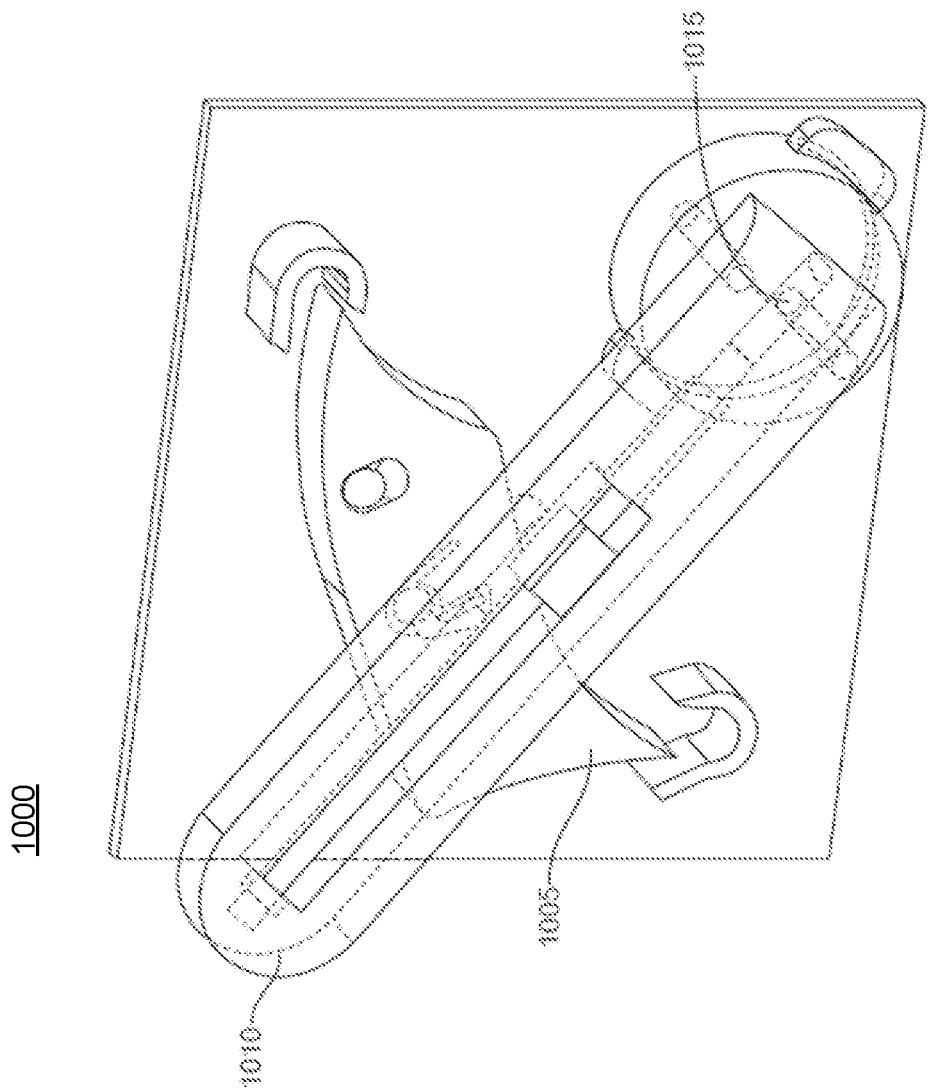

FIGS. 10A-10C illustrate variations of an example hinge 1000, in accordance with one or more embodiments. In FIG. 10A, the hinge 1000 includes a cam 1005 and a cam follower 1010 that are coupled to a plurality of springs that move the cam follower 1010 about a pivot point 1015. In the embodiment of FIG. 10A, the cam follower 1010 is positioned at a 45 degree angle, but the angle may vary in other embodiments. FIG. 10B illustrates a hinge 1020 having a cam 1025 having a different geometry that is configured to translate along a slot 1030, thereby causing rotation of the cam 1025 relative to a pin 1035. FIG. 10C illustrates the hinge 1040 having a cam 1045 having a different geometry and including two double-acting pins 1050.

Figure 11B:
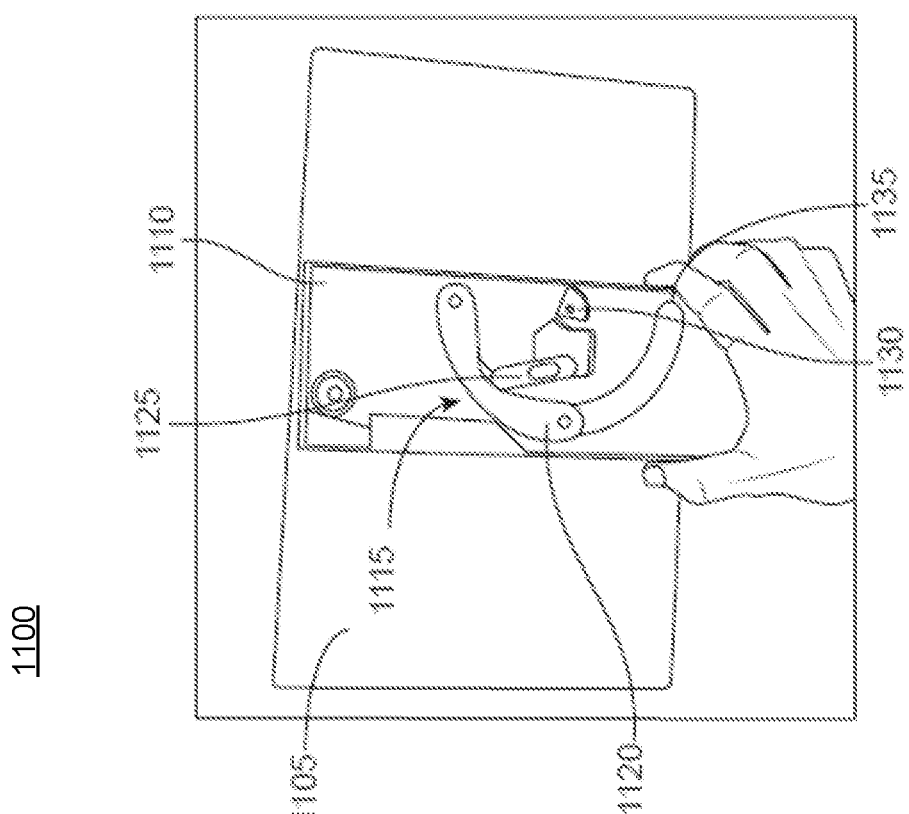
FIGS. 11A-11C illustrate perspective views of an example communication system 1100, in accordance with one or more embodiments.
Figure 11A:
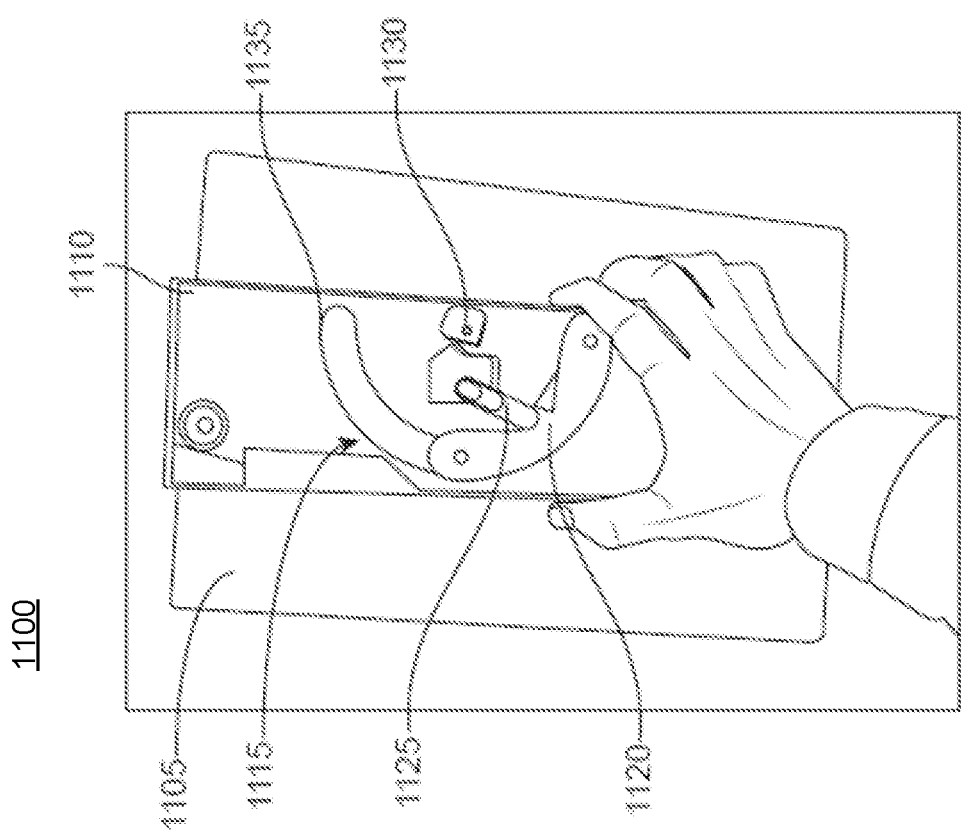
Figure 11C:
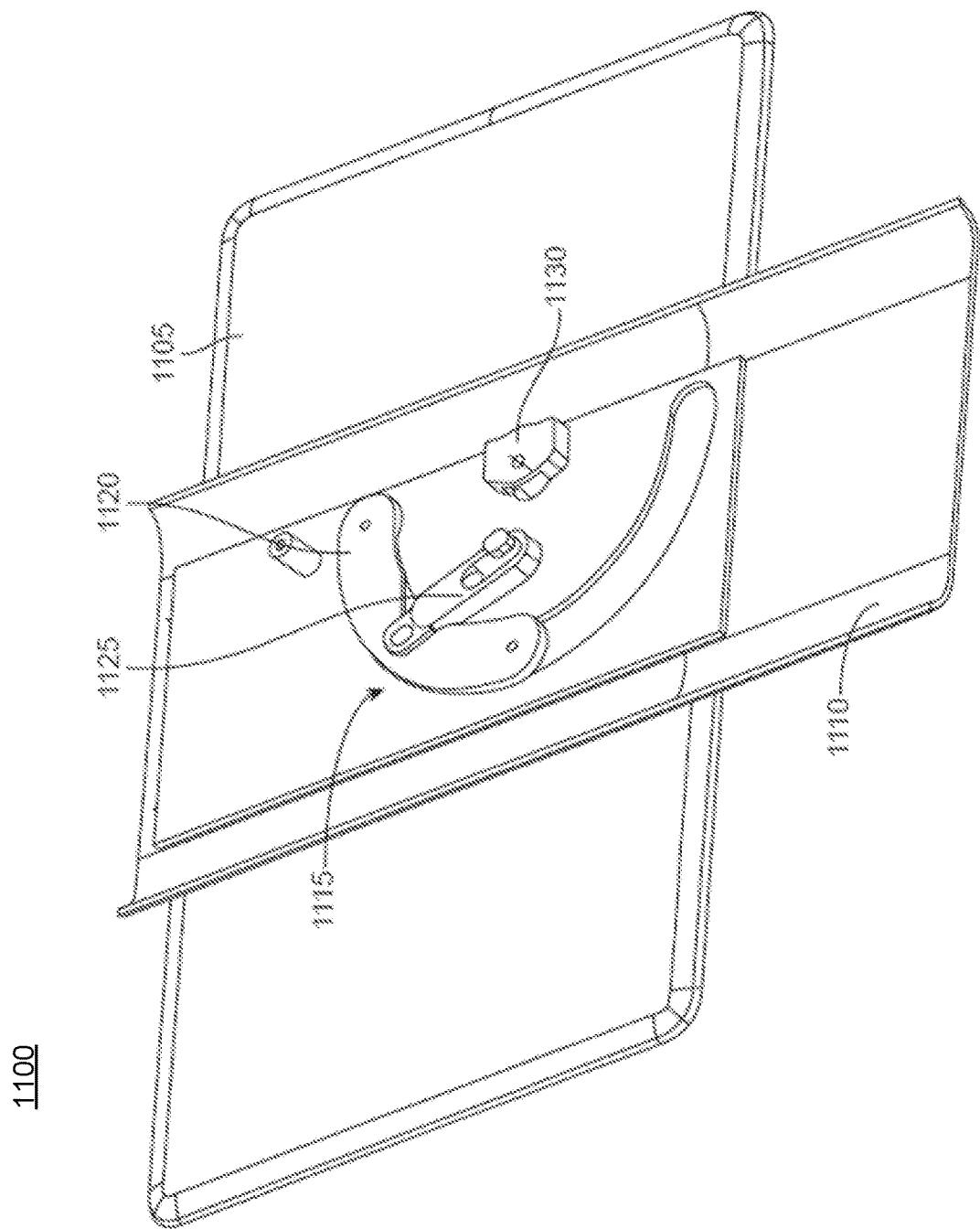

FIGS. 11A-11C illustrate perspective views of an example communication system 1100, in accordance with one or more embodiments. The communication system 1100 includes a user device 1105 that is secured to a device mount 1110 via a hinge 1115. In the embodiment of FIGS. 11A-11C, the hinge 1115 includes a slider 1120 and an over-center spring 1125 that enable the hinge to rotate about a pivot point 1130. FIG. 11A illustrates the communication system 1100 in a portrait mode, and FIG. 11B illustrates the communication system 1100 in a landscape mode. Upon receiving user input to actuate the hinge 1115, the slider 1120 slides through the slot 1135, and the spring 1125 provides a counterbalancing force.

Figure 12:
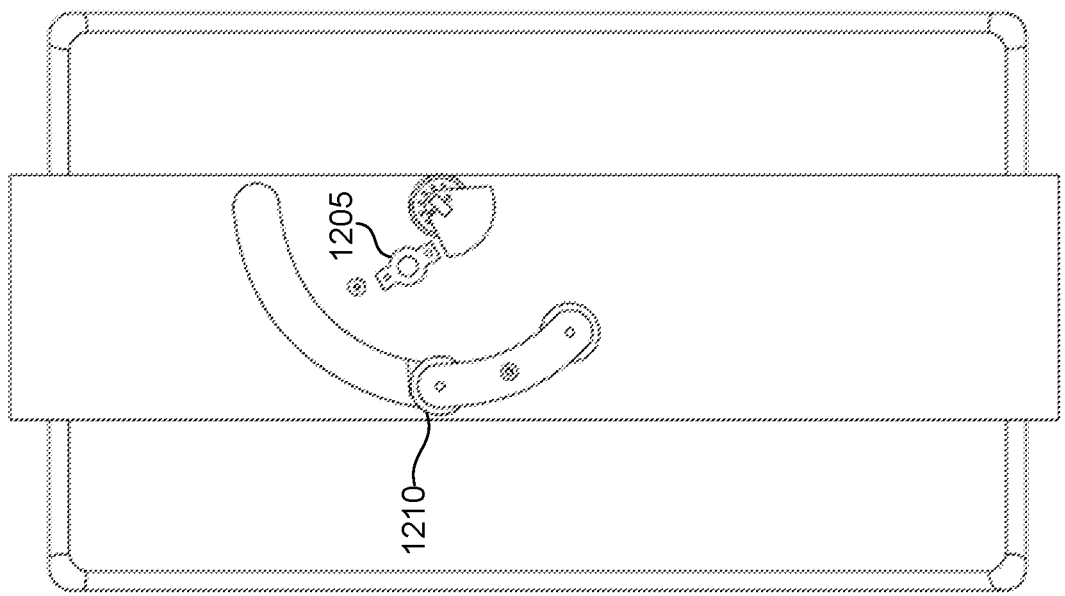
FIG. 12 illustrates a variation of the hinge of FIGS. 11A-11C, in accordance with one or more embodiments.

FIG. 12 illustrates a variation of the hinge of FIGS. 11A-11C, in accordance with one or more embodiments. A hinge 1200 is similar to hinge 1115 and further includes a damping mechanism. In the embodiment of FIG. 12, the hinge 1200 includes a damping gear 1205 and a radial damper 1210. The damping mechanism dampens the motion of the hinge 1115 to enable a smooth transition between a portrait mode and a landscape mode.

Figure 13:
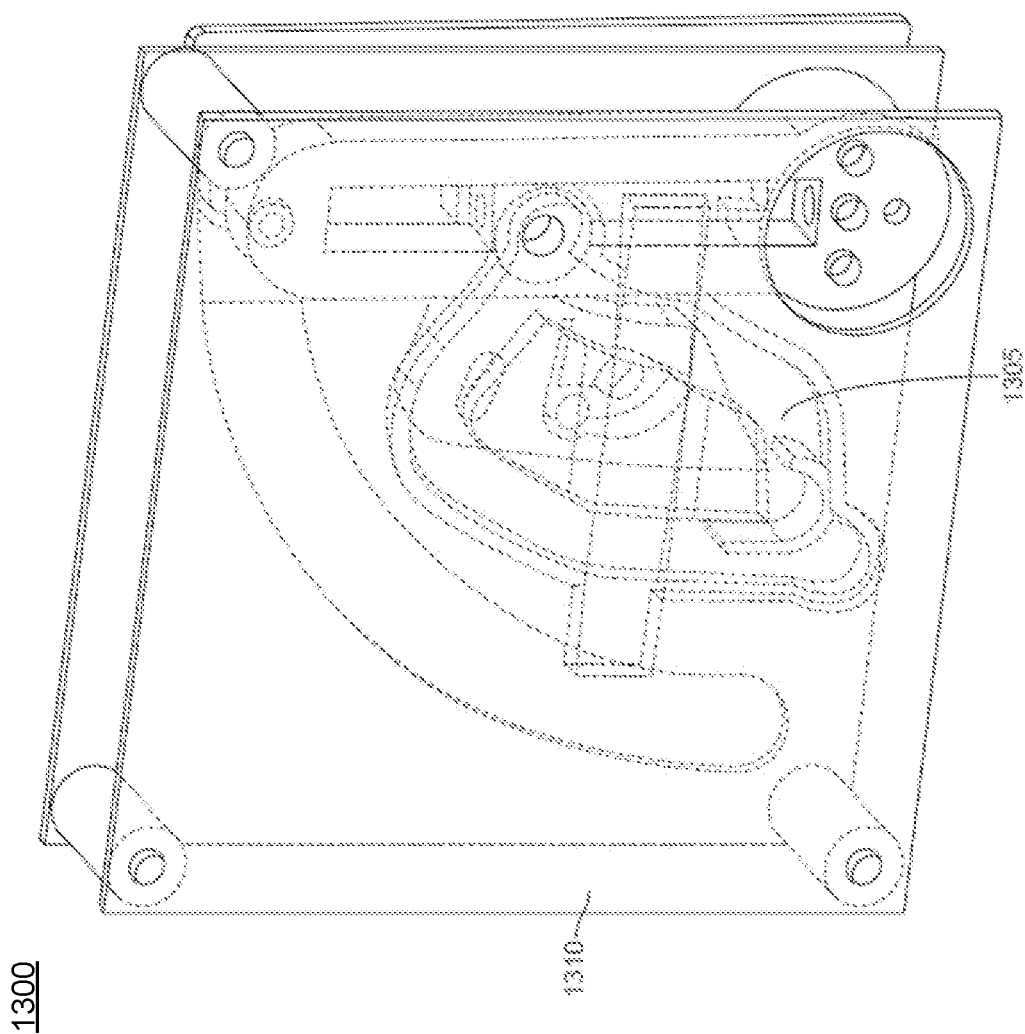
FIG. 13 illustrates a variation of the hinge of FIGS. 11A-11C, in accordance with one or more embodiments.

FIG. 13 illustrates a variation of the hinge of FIGS. 11A-11C, in accordance with one or more embodiments. A hinge 1300 is similar to hinge 1115 and includes a cam 1305 and a plurality of extension springs (not shown) in lieu of the over-center spring 1125. The hinge 1300 further includes a back plate 1310 to counter a moment created by a shuttle of the hinge 1300 and the plurality of springs.

Figure 14:
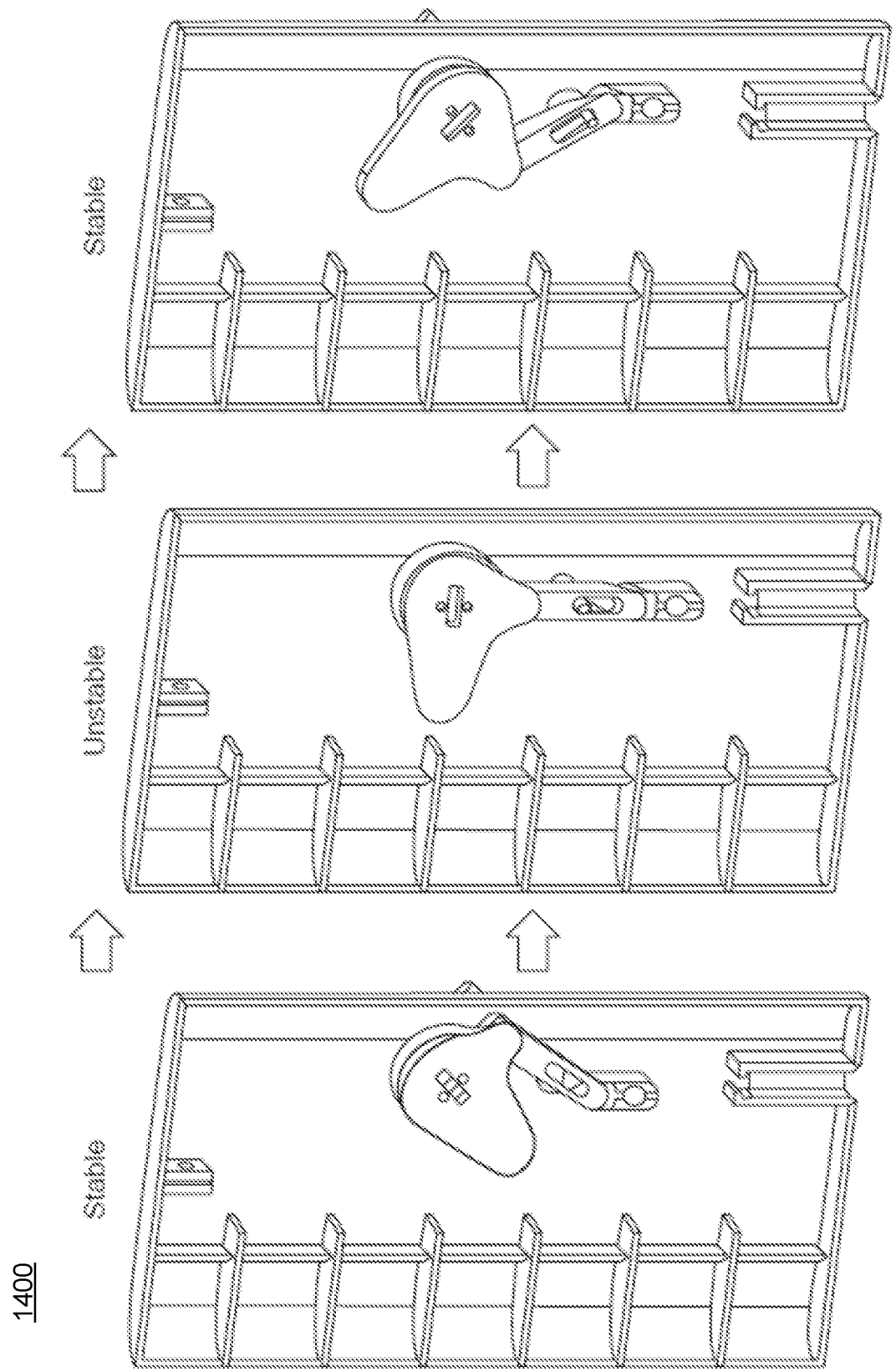
FIG. 14 illustrates a transition of an example hinge between a portrait mode and a landscape mode, in accordance with one or more embodiments.

FIG. 14 illustrates a transition of an example hinge 1400 between a portrait mode and a landscape mode, in accordance with one or more embodiments. The hinge 1400 is similar to hinge 1115 in operation, while the hinge 1400 simplifies the attachment mechanism for securing a device, reduces part count, and adds an option to include a linear damper in the hinge 1400.

Figure 15:
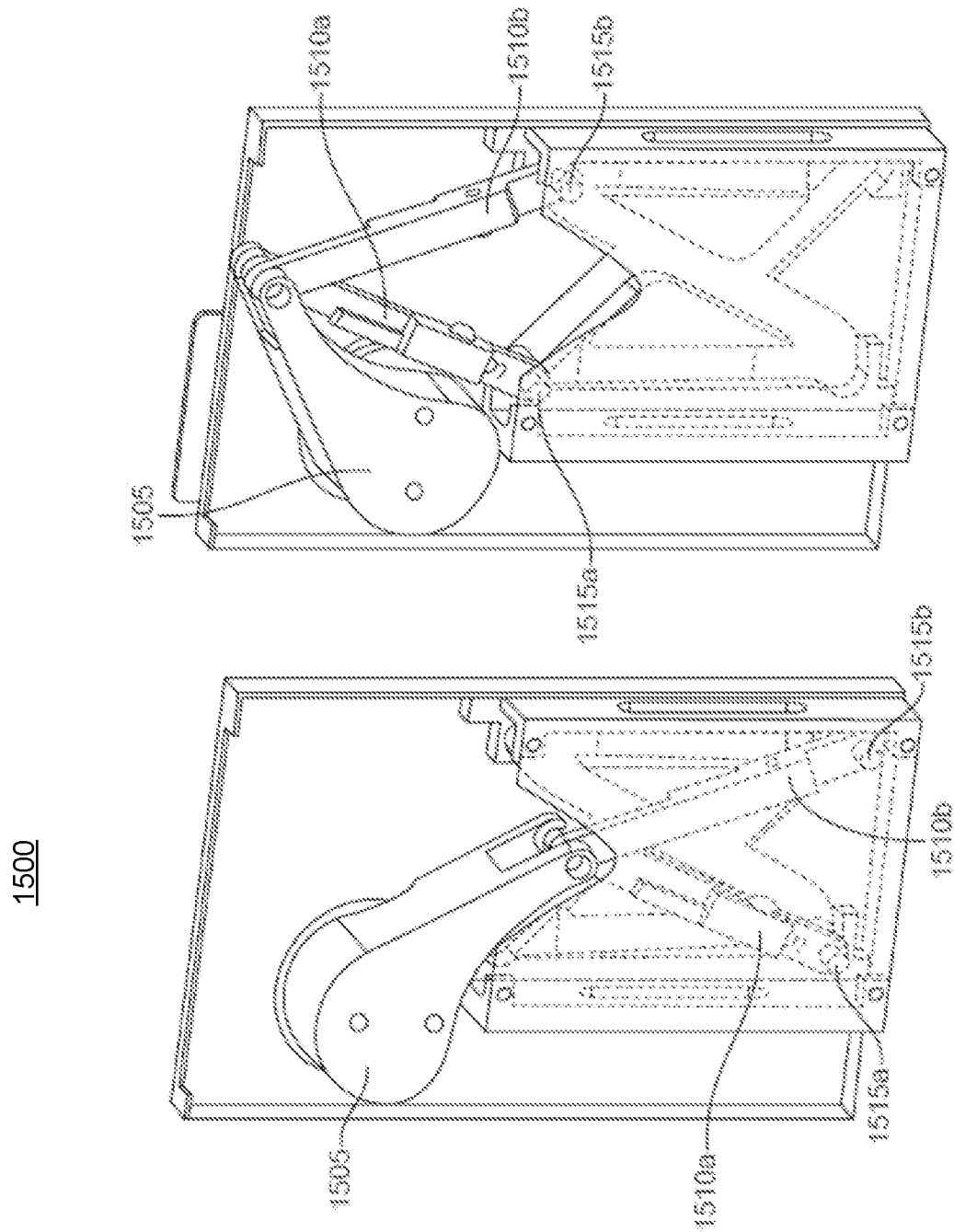
FIG. 15 illustrates an example hinge, in accordance with one or more embodiments.
Figure 17:
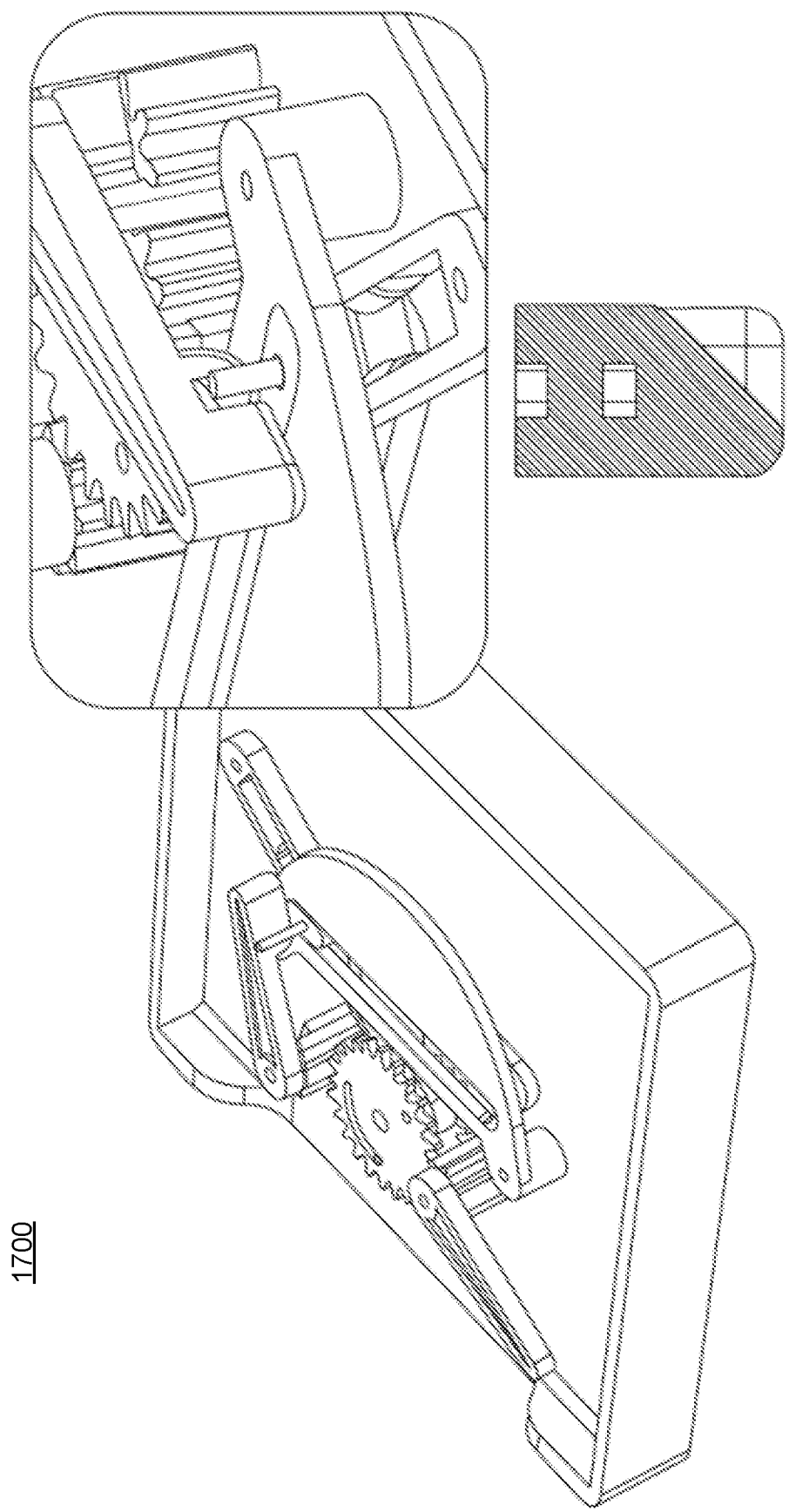
FIG. 17 illustrates an example hinge, in accordance with one or more embodiments.

FIG. 15 illustrates an example hinge 1500, in accordance with one or more embodiments. The hinge 1500 includes a cam 1505 that is coupled to two linear segments 1510, where each segment 1510 includes a dowel pin 1515 at a distal end. The dowel pins are designed to move along respective linear tracks as the cam 1505 rotates. In the embodiment of FIG. 17, the linear tracks have an angle of 20 degrees relative to each other.

Figure 16:
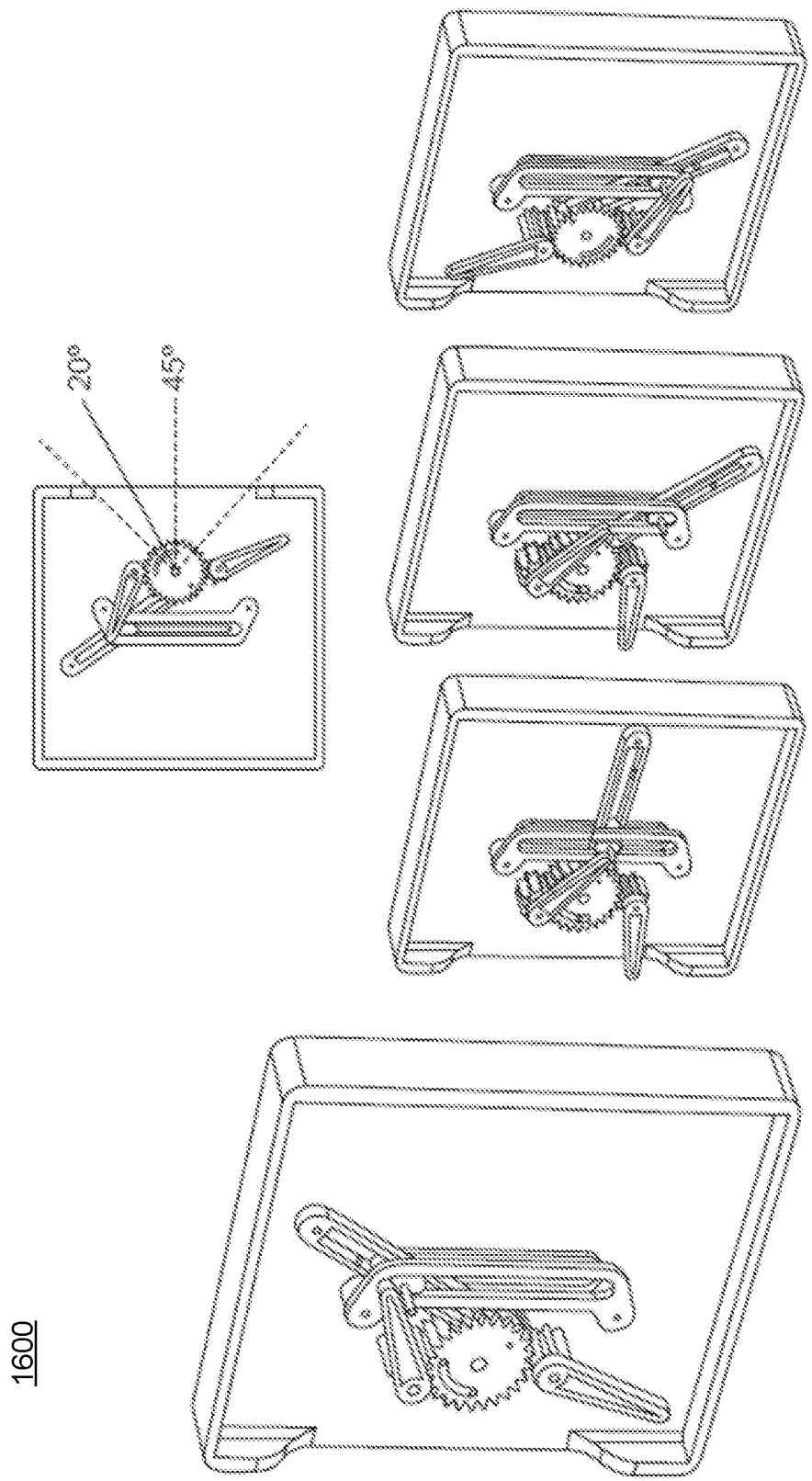
FIG. 16 illustrates an example hinge, in accordance with one or more embodiments.

FIG. 16 illustrates an example hinge 1600, in accordance with one or more embodiments. The hinge 1600 uses a planetary gear system to rotate and translate a device between the portrait mode and the landscape mode. In the embodiment of FIG. 16, the planetary gear system has a pressure angle of 20 degrees.

FIG. 17 illustrates an example hinge 1700, in accordance with one or more embodiments. Similar to the hinge 1600, the hinge 1700 uses a planetary gear system to rotate and translate a device between the portrait mode and the landscape mode. In the embodiment of FIG. 17, the planetary gear system has a pressure angle of 20 degrees.

Additional Configuration Information

The foregoing description of the embodiments of the disclosure has been presented for the purpose of illustration; it is not intended to be exhaustive or to limit the disclosure to the precise forms disclosed. Persons skilled in the relevant art can appreciate that many modifications and variations are possible in light of the above disclosure.

Some portions of this description describe the embodiments of the disclosure in terms of algorithms and symbolic representations of operations on information. These algorithmic descriptions and representations are commonly used by those skilled in the data processing arts to convey the substance of their work effectively to others skilled in the art. These operations, while described functionally, computationally, or logically, are understood to be implemented by computer programs or equivalent electrical circuits, microcode, or the like. Furthermore, it has also proven convenient at times, to refer to these arrangements of operations as modules, without loss of generality. The described operations and their associated modules may be embodied in software, firmware, hardware, or any combinations thereof.

Any of the steps, operations, or processes described herein may be performed or implemented with one or more hardware or software modules, alone or in combination with other devices. In one embodiment, a software module is implemented with a computer program product comprising a computer-readable medium containing computer program code, which can be executed by a computer processor for performing any or all of the steps, operations, or processes described.

Embodiments of the disclosure may also relate to an apparatus for performing the operations herein. This apparatus may be specially constructed for the required purposes, and/or it may comprise a general-purpose computing device selectively activated or reconfigured by a computer program stored in the computer. Such a computer program may be stored in a non-transitory, tangible computer readable storage medium, or any type of media suitable for storing electronic instructions, which may be coupled to a computer system bus. Furthermore, any computing systems referred to in the specification may include a single processor or may be architectures employing multiple processor designs for increased computing capability.

Embodiments of the disclosure may also relate to a product that is produced by a computing process described herein. Such a product may comprise information resulting from a computing process, where the information is stored on a non-transitory, tangible computer readable storage medium and may include any embodiment of a computer program product or other data combination described herein.

Finally, the language used in the specification has been principally selected for readability and instructional purposes, and it may not have been selected to delineate or circumscribe the inventive subject matter. It is therefore intended that the scope of the disclosure be limited not by this detailed description, but rather by any claims that issue on an application based hereon. Accordingly, the disclosure of the embodiments is intended to be illustrative, but not limiting, of the scope of the disclosure, which is set forth in the following claims.

What is claimed is:

1. A device mount comprising:
   a camera positioned above a top edge of a display coupled to the device mount, wherein an aspect ratio of the display is greater or less than 1:1;
   a base of the device mount configured to support a rotation of the display, wherein the position of the camera is fixed relative to the base of the device mount; and
   a hinge configured to rotate the coupled display, the hinge comprising:
      a mounting plate configured to couple the hinge to the device mount;
      a shuttle configured to couple the display to the hinge to rotate the display between a landscape mode and a portrait mode, wherein rotation of the display into the portrait mode translates a center of the display away from the camera on a vertical axis and rotation of the display into the landscape mode translates the center of the display towards the camera on the vertical axis; and
      a spring configured to counterbalance a mass of the display coupled to the shuttle, wherein the spring comprises a first end coupled to the shuttle by a spring link and a second end coupled to an adjustment slide by a threaded interface and a screw, the adjustment slide enabling adjustments to a tension of the spring.

2. The device mount of claim 1, further comprising:
   a bearing cap configured to insert into an opening in the mounting plate to couple the mounting plate to the device mount;
   a shuttle bushing configured to couple the mounting plate to the shuttle.

3. The device mount of claim 1, wherein the mounting plate comprises one or more slots tracing a path along which the shuttle rotates and the shuttle is configured to rotate about a pivot point, the rotation of the shuttle causing at least one shuttle bushing to move through each of the one or more slots in the mounting plate.

4. The device mount of claim 3, wherein the hinge further comprises a bearing configured to enable the rotation of the shuttle about the pivot point, the bearing comprising:
   an outer ring in a fixed position internal to a bearing cap;
   an inner ring configured to secure the shuttle to rotate about the pivot point; and
   a plurality of balls configured to enable the rotation of the inner ring about the pivot point.

5. The device mount of claim 1:
   wherein the spring stabilizes rotation of the shuttle relative to the mounting plate;
   wherein the first end of the spring is coupled to the mounting plate by a spring bushing and the second end of the spring is coupled to the shuttle by a shuttle bushing.

6. The device mount of claim 1, further comprising:
   at least one stop block coupled to an edge of the shuttle;
   at least one end stop corresponding to each stop block, wherein each end stop is coupled to the device mount to stop the rotation of the shuttle upon contact between the stop block and a corresponding end stop; and
   a stop lock configured to magnetically secure the shuttle in a position where the stop block contacts the corresponding end stop.

7. The device mount of claim 6, further comprising:
   a cam dampening mechanism configured to slow rotation of the shuttle at the end stop, the cam dampening mechanism comprising:
      a rotary damper coupled to the shuttle; and
      a cam coupled to the shuttle, the cam positioned to slide within a slot in the mounting plate as the shuttle rotates.

8. The device mount of claim 1, further comprising:
   a gear dampening mechanism configured to slow rotation of the shuttle, the gear dampening mechanism comprising:
      a rotary damper coupled to the mounting plate; and
      a gear coupled to the shuttle.

9. A method for assembling a device mount, the method comprising:
   aligning a mounting plate of a hinge with a mounting interface on the device mount, wherein the device mount comprises a camera positioned above a top edge of a display coupled to the device mount and a base of the device mount, wherein the position of the camera is fixed relative to the base of the device mount that supports a rotation of the display;
   coupling the aligned hinge to the mounting interface using a first set of screws, the hinge further comprising a shuttle configured to rotate the display coupled to the device mount between a landscape mode and a portrait mode, wherein rotation of the display into the portrait mode translates a center of the display away from the camera on a vertical axis and rotation of the display into the landscape mode translates the center of the display towards the camera on the vertical axis; and aligning a locating ring on the display with the shuttle of the hinge;

coupling the aligned display to the shuttle of the hinge using a second set of screws; and counterbalancing a mass of the display coupled to the shuttle by a spring, wherein a first end of the spring is coupled to the shuttle by a spring link and a second end of the spring is coupled to an adjustment slide by a threaded interface and a screw corresponding to the threaded interface such that the adjustment slide enabling adjustments to a tension of the spring.

10. The method of claim 9, further comprising:
inserting a bearing cap into an opening in the mounting plate to couple the mounting plate to the device mount;
coupling the mounting plate to the shuttle by a shuttle bushing; and
coupling the locating ring of the display to the shuttle by the second set of screws.

11. The method of claim 9, further comprising:
rotating the shuttle about a pivot point, the rotation of the shuttle causing a shuttle bushing to move through a slot in the mounting plate tracing a path along which the shuttle rotates.

12. The method of claim 11, wherein the hinge further comprises a bearing configured to enable the rotation of the shuttle about the pivot point, the bearing comprising:
an outer ring in a fixed position internal to a bearing cap;
an inner ring configured to secure the shuttle to rotate about the pivot point; and
a plurality of balls configured to enable the rotation of the inner ring about the pivot point.

13. The method of claim 9, further comprising:
stabilizing rotation of the shuttle relative to the mounting plate with the spring, wherein the first end of the spring is coupled to the mounting plate by a spring bushing and the second end of the spring is coupled to the shuttle by a shuttle bushing.

14. The method of claim 9, further comprising:
stopping the rotation of the shuttle upon contact between a stop block coupled to an edge of the shuttle and a corresponding end stop coupled to the device mount; and
magnetically securing, by a stop lock, the shuttle in a position where the stop block contacts the corresponding end stop.

15. The method of claim 14, further comprising:
slowing the rotation of the shuttle at the end of stop using a cam dampening mechanism, the cam dampening mechanism comprising:
a rotary damper coupled to the shuttle; and
a cam coupled to the shuttle, the cam positioned to slide within a slot in the mounting plate as the shuttle rotates.

16. The method of claim 9, further comprising:
slowing the rotation of the shuttle using a gear dampening mechanism, the gear dampening mechanism comprising:
a rotary damper coupled to the mounting plate; and
a gear coupled to the shuttle.

* * * * *